(12) United States Patent
Izumi et al.

(10) Patent No.: US 12,349,573 B2
(45) Date of Patent: Jul. 1, 2025

(54) ORGANIC ELECTROLUMINESCENT ELEMENT, METHOD FOR PRODUCING SAME AND DISPLAY DEVICE

(71) Applicant: Konica Minolta, Inc., Tokyo (JP)

(72) Inventors: Tomoo Izumi, Toyonaka (JP); Hideo Taka, Inagi (JP); Hiroyuki Isobe, Tokyo (JP); Sota Sato, Tokyo (JP); Koki Ikemoto, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 447 days.

(21) Appl. No.: 17/756,493

(22) PCT Filed: Nov. 20, 2020

(86) PCT No.: PCT/JP2020/043357
§ 371 (c)(1),
(2) Date: May 26, 2022

(87) PCT Pub. No.: WO2021/111898
PCT Pub. Date: Jun. 10, 2021

(65) Prior Publication Data
US 2023/0020129 A1   Jan. 19, 2023

(30) Foreign Application Priority Data
Dec. 6, 2019   (JP) .................. 2019-220850

(51) Int. Cl.
*H10K 59/17*   (2023.01)
*H10K 50/13*   (2023.01)
(Continued)

(52) U.S. Cl.
CPC ........... *H10K 59/17* (2023.02); *H10K 50/131* (2023.02); *H10K 71/00* (2023.02); *H10K 85/342* (2023.02);
(Continued)

(58) Field of Classification Search
None
See application file for complete search history.

(56) References Cited

U.S. PATENT DOCUMENTS

| 6,066,357 A | 5/2000 | Tang et al. |
| 6,555,840 B1 | 4/2003 | Hudson et al. |

FOREIGN PATENT DOCUMENTS

| JP | H11-54270 A | 2/1999 |
| JP | H11-271753 A | 10/1999 |

(Continued)

OTHER PUBLICATIONS

PCT, International Search Report for the corresponding application No. PCT/JP2020/043357, dated Dec. 22, 2020, with English translation.

(Continued)

*Primary Examiner* — Anthony Ho
(74) *Attorney, Agent, or Firm* — LUCAS & MERCANTI, LLP

(57) ABSTRACT

An organic electroluminescent element has at least one pair of electrodes including an anode and a cathode and one or more organic functional layers between the anode and the cathode that are in a pair. The organic electroluminescent element includes an organic functional layer that exists as a continuous phase over an entire display area and includes an at least one light emitting compound with a concentration gradient in an in-plane direction and in a thickness direction of the organic functional layer.

10 Claims, 10 Drawing Sheets

(51) Int. Cl.
*H10K 71/00* (2023.01)
*H10K 85/30* (2023.01)
*H10K 85/60* (2023.01)

(52) U.S. Cl.
CPC ......... *H10K 85/621* (2023.02); *H10K 85/656* (2023.02); *H10K 85/657* (2023.02); *H10K 85/6572* (2023.02); *H10K 85/6574* (2023.02)

(56) References Cited

FOREIGN PATENT DOCUMENTS

| | | |
|---|---|---|
| JP | 2000-188180 A | 7/2000 |
| JP | 2000-228283 A | 8/2000 |
| JP | 2000-243562 A | 9/2000 |
| JP | 2001-189193 A | 7/2001 |
| JP | 2006-223954 A | 8/2006 |
| JP | 2013-089524 A | 5/2013 |

OTHER PUBLICATIONS

Coenen, Michiel et al., "Inkjet printing the three organic functional layers of two-colored organic light emitting diodes," Thin Solid Films, 2015, 583, pp. 194-200.
PCT, Written Opinion of ISA for the corresponding application No. PCT/JP2020/043357, dated Dec. 22, 2020, with English translation.
Japanese Patent Office, Office Action dated Jan. 16, 2024, for the corresponding Japanese Patent Application No. 2021-562565, with English translation (7 pages).
Office Action dated Oct. 24, 2023, for the corresponding Japanese Application No. 2021-562565, with English translation.

⇩ Light

| Cycles | Luminance (Normalized)* |
|---|---|
| 1 | 0.98 |
| 2 | 0.98 |
| 3 | 0.96 |
| 4 | 0.97 |
| 5 | 0.97 |
| 6 | 0.97 |
| 7 | 0.97 |
| 8 | 0.96 |
| 9 | 0.96 |
| 10 | 0.96 |
| 11 | 0.96 |
| 12 | 0.96 |
| 13 | 0.97 |
| Maximum value | 0.98 |
| Minimum value | 0.96 |
| Difference | 0.03 |

* :Average of 10 pixels in the center of the dot

| Cycles | Luminance (Normalized)* |
|---|---|
| 1 | 0.83 |
| 2 | 0.83 |
| 3 | 0.83 |
| 4 | 0.82 |
| 5 | 0.81 |
| 6 | 0.82 |
| 7 | 0.81 |
| 8 | 0.81 |
| 9 | 0.82 |
| 10 | 0.83 |
| 11 | 0.84 |
| 12 | 0.87 |
| 13 | 0.87 |
| Maximum value | 0.87 |
| Minimum value | 0.81 |
| Difference | 0.06 |

* : Average of 10 pixels in the center of the dot

| Cycles | Luminance (Normalized)* |
|---|---|
| 1 | 0.88 |
| 2 | 0.87 |
| 3 | 0.86 |
| 4 | 0.86 |
| 5 | 0.85 |
| 6 | 0.85 |
| 7 | 0.85 |
| 8 | 0.85 |
| 9 | 0.85 |
| 10 | 0.85 |
| 11 | 0.86 |
| 12 | 0.86 |
| 13 | 0.87 |
| 14 | 0.87 |
| Maximum value | 0.88 |
| Minimum value | 0.85 |
| Difference | 0.04 |

* : Average of 10 pixels in the center of the dot

⇩ LIGHT

FIG. 10A
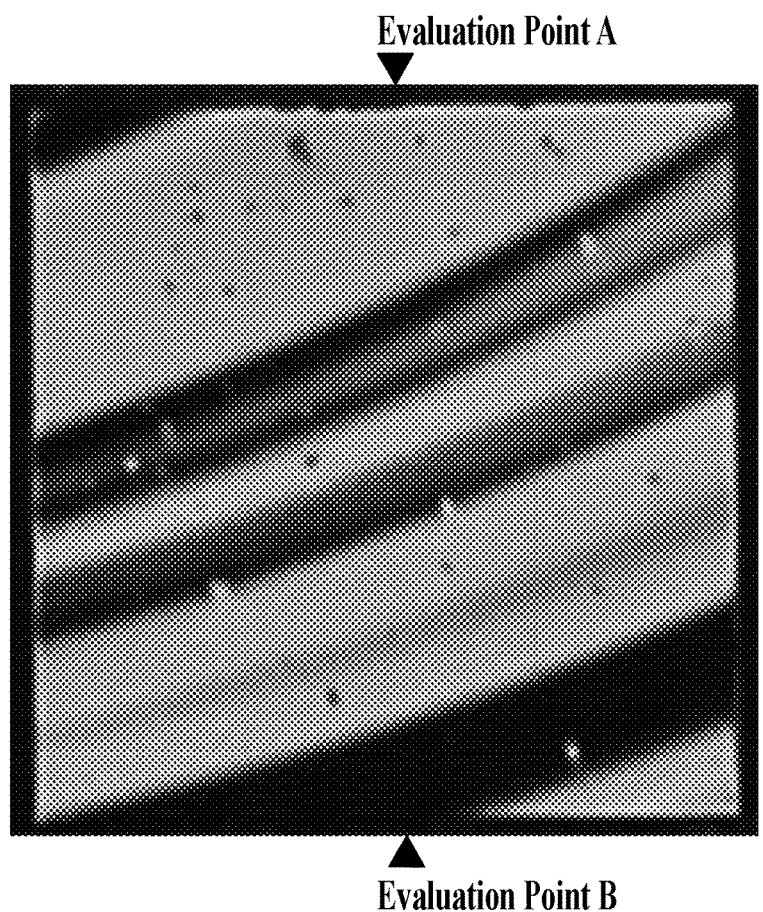
Evaluation Point A
Evaluation Point B
FIG. 10B
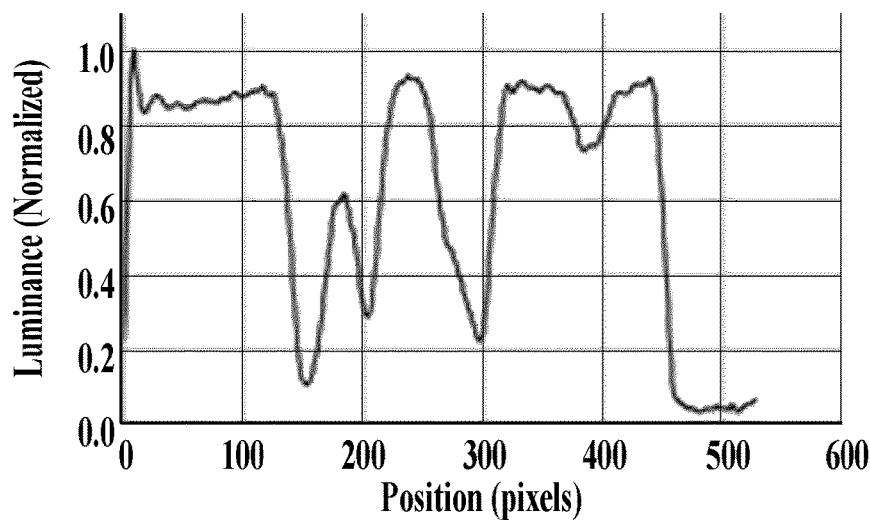
FIG. 10C
| Cycles | Luminance (Normalized) |
|---|---|
| Maximum value | 1.00 |
| Minimum value | 0.03 |
| Difference | 0.97 |

ORGANIC ELECTROLUMINESCENT ELEMENT, METHOD FOR PRODUCING SAME AND DISPLAY DEVICE

CROSS REFERENCE TO RELATED APPLICATION

This Application is a 371 of PCT/JP2020/043357 filed on Nov. 20, 2020, which, in turn, claims priority of Japanese Patent Application No. 2019-220850 filed on Dec. 6, 2019, and the above applications are incorporated herein by reference.

TECHNOLOGICAL FIELD

The present invention relates to an organic electroluminescent element, a method for producing same, and a display device. More specifically, the present invention relates to an organic electroluminescent element that prevents in-plane unevenness and color mixing by dot emission in a simple display system that does not require pixel electrodes.

BACKGROUND

Organic electroluminescent displays are very complex in configuration because they require thin-film transistors (abbreviated as "TFT") and pixel electrodes to drive each pixel individually. In addition, the complicated production process associated with the extremely complex configuration causes a major problem of low yield.

In recent years, for the purpose of improving efficiency of using a material, the emission layer (abbreviated as "EML") has been proposed to be produced using an inkjet printing method. However, it is necessary to perform inkjet application for each individual pixel electrode, which results in further increase in the aforementioned problems (see, for example, patent literatures 1, 2, 3, and 4).

As a method to solve these major problems, a method to manufacture an organic electroluminescent element (hereafter, abbreviated as "organic EL element" or "OLED," also referred to as "organic light emitting diode") using an inkjet printing method without forming TFTs or pixel electrodes has been proposed (see, for example, non-patent literature 1). In this non-patent literature 1, as a method of manufacturing a display with a simple configuration, a multi-color display system has been proposed in which a mixture film of multiple host compounds and light emitting compounds (hereinafter also referred to as "emitters") is arranged between electrodes that are in a pair in an in-plane direction. This example does not require TFTs or individual pixel electrodes, and thus solves the problem regarding yields. Furthermore, it is a breakthrough method in that images can be formed regardless of the resolution or aperture ratio (area of individual electrodes) of individual electrodes.

On the other hand, examination by the present inventors revealed that the non-patent literature 1 causes problems such as color mixing due to mixing of materials of the light emitting compounds (emitters), uneven luminance due to difficulty in maintaining uniformity of the film, and the like since the non-patent literature 1 discloses a configuration in which the mixture film of multiple host compounds and light emitting compounds is arranged between the electrodes that are in a pair in the in-plane direction.

Therefore, in a full-color display system using a pair of electrodes, it is desired to develop an organic electroluminescent element that prevents in-plane unevenness and color mixing even in forming a high-definition image.

CITATION LIST

Patent Literature

[Patent Literature 1] JP H11-271753 A
[Patent Literature 2] JP 2006-223954 A
[Patent Literature 3] JP H11-54270 A
[Patent Literature 4] JP 2001-189193 A

Non-Patent Literature

[Non-Patent Literature 1] Michiel J. J. Coenen et al; Inkjet printing the three organic functional layers of two-colored organic light emitting diode; Thin Solid Films 583 (2015) 194-200

SUMMARY

Technical Problem

The present invention was made in view of the above problems and circumstances, and its object is to provide an organic electroluminescent element, a method for producing same, and a display device using the organic electroluminescent element that prevent in-plane unevenness and color mixing in a full-color display system using a pair of electrodes, even in forming a high-definition image.

Solution to Problem

In order to solve the above problem, the present inventors have investigated the preferred state of mutual existence of the host compound and the light emitting compound in the light emitting layer. In the course of their investigation, they found that the above problems can be solved by dropping a solution containing a light emitting compound onto a surface of a layer containing a host compound formed in advance, such that the light emitting compound is contained in a dot shape with concentration gradient on the surface of the layer containing the host compound.

In other words, the above issues related to the present invention are solved by the following means.

1. An organic electroluminescent element having at least one pair of electrodes including an anode and a cathode and one or more organic functional layers between the anode and the cathode that are in a pair, including:
   an organic functional layer that exists as a continuous phase over an entire display area and includes an at least one light emitting compound with a concentration gradient in an in-plane direction and in a thickness direction of the organic functional layer.

2. The organic electroluminescent element according to item 1, wherein the organic functional layer has the concentration gradient in a pattern that is repeated a plurality of times in the in-plane direction.

3. The organic electroluminescent element according to item 1 or item 2, wherein, in the organic functional layer, a maximum luminance in the in-plane direction is more than twice a minimum luminance in the in-plane direction.

4. The organic electroluminescent element according to any one of item 1 to item 3, wherein the light emitting compound exists in a shape of dots in the in-plane direction.

5. The organic electroluminescent element according to any one of item 1 to item 4, wherein the light emitting compound includes multiple types of different light emitting compounds.

6. The organic electroluminescent element according to any one of item 1 to item 5, wherein dots that emit light of same color are adjacent to each other in the in-plane direction.

7. A method for producing an organic electroluminescent element having at least one pair of electrodes including an anode and a cathode and one or more organic functional layers between the anode and the cathode in the pair, the method including
forming the anode and the cathode in a pair each individually;
forming an organic functional layer that exists as a continuous phase over an entire display area; and
dropping a solution containing a light emitting compound onto the organic functional layer to form an organic functional layer containing the light emitting compound with a concentration gradient.

8. The method for producing an organic electroluminescent element according to item 7, further including:
forming a second organic functional layer on the organic functional layer containing the light emitting compound.

9. The method for producing an organic electroluminescent element according to item 7 or item 8, wherein the solution containing the light emitting compound is dropped by an inkjet printing method.

10. A display device including the organic electroluminescent element according to any one of item 1 to item 6.

Advantageous Effects of Invention

The above means of the present invention make it possible to provide an organic electroluminescent element that prevents in-plane unevenness and color mixing in a full-color display system using a pair of electrodes, even in forming a high-definition image, a method for producing same, and a display device using the organic electroluminescent element.

The expression mechanism of the effects or the action mechanism of the invention is not clear, but is inferred to be as follows.

In the present invention, an organic functional layer that exists as a continuous phase over the entire display area is used as a base. For example, an organic functional layer containing a host compound is used as a base, and a light emitting compound is contained on its surface with a concentration gradient. For example, at least dots consisting of a luminescent compound are formed by landing and adhering a light emitting compound-containing liquid on the organic functional layer (base) using an inkjet printing method. A layer of the light emitting compound (hereinafter referred to as an "emitter dot layer"), which is a set of the dots, is formed.

Unlike the solutions containing host compounds and light emitting compounds shown in the above-mentioned Patent Literature 1, 2, and 3, by using an inkjet solution in which the light emitting compound is the main solute, the light emitting compound spreads less after dropping. Therefore, it is not necessary to form a bank, and in-plane unevenness is presumed to be prevented. The absence of in-plane unevenness is also expected to prevent color mixing even when forming high-definition images.

BRIEF DESCRIPTION OF THE DRAWINGS

FIGS. 10A to 10C are diagrams showing an optical micrograph (A) and a relationship between positions and luminance (B) of an organic EL element of a comparative example upon voltage application, and the maximum and minimum values of the luminance (C).

DETAILED DESCRIPTION OF EMBODIMENTS

Figure 1A:
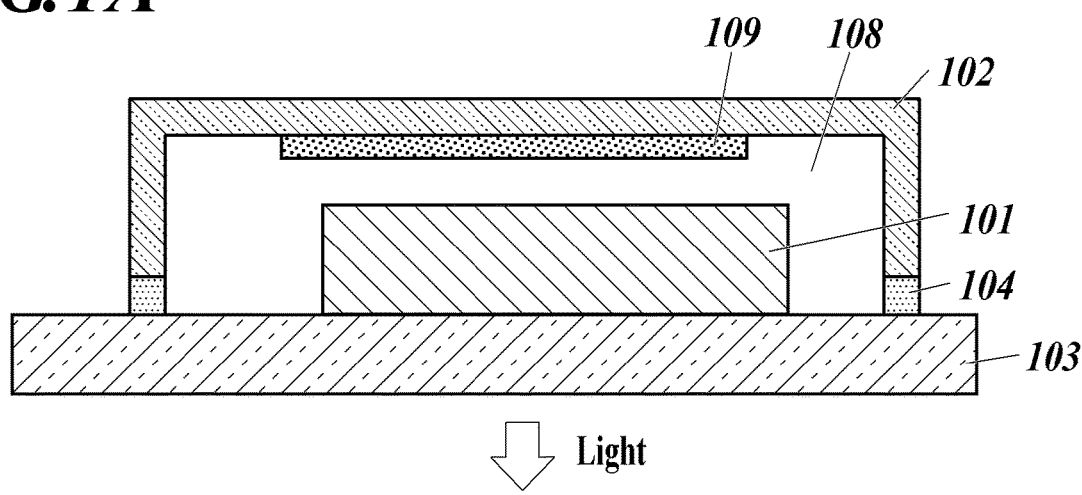
FIGS. 1A and 1B are schematic diagrams showing cross-sections of an organic EL display device and an organic EL element.

The organic electroluminescent element of the present invention has at least one pair of electrodes including an anode and a cathode and one or more organic functional layers between the anode and the cathode that are in the pair, and characterized by including:
an organic functional layer that exists as a continuous phase over an entire display area and includes an at least one light emitting compound with a concentration gradient in an in-plane direction and in a thickness direction of the organic functional layer. This feature is a technical feature common to or corresponding to the following embodiments.

From the viewpoint of expressing the effect of the present invention, in an embodiment of the present invention, it is preferable that the organic functional layer has the concentration gradient in a pattern that is repeated a plurality of times in the in-plane direction.

Also, the organic functional layer preferably has a maximum luminance in the in-plane direction that is more than twice a minimum luminance in the in-plane direction. Furthermore, from the viewpoint of reproducibility and accuracy of even luminance, the light emitting compound preferably exists in a shape of dots in the in-plane direction.

Furthermore, in the case of multi-color light emission, the light emitting compound preferably includes multiple types of different light emitting compounds. Also, the dots that emit light of same color are preferably adjacent to each other in the in-plane direction.

A method for producing an organic electroluminescent element of the present invention has at least one pair of electrodes including an anode and a cathode and one or more organic functional layers between the anode and the cathode in the pair, and the method is characterized by including, in addition to a step of forming the anode and the cathode in the pair each individually, a step 1 of forming an organic functional layer that exists as a continuous phase over an entire display area; and a step 2 of dropping a solution containing a light emitting compound onto the organic functional layer to form an organic functional layer containing the light emitting compound with a concentration gradient.

In an embodiment of the present invention, it is preferable that the method further includes a step 3 of forming a second organic functional layer on the organic functional layer containing the light emitting compound. Also, the solution containing the light emitting compound is preferably dropped by an inkjet printing method from the viewpoint of simplicity and not requiring bank formation.

The organic electroluminescent element of the present invention can be suitably used for a display device.

In the following, the present invention, its components, and the embodiments and modes of carrying out the present invention will be described in detail. In this application, "to" is used to mean the numerical values described before and after it are included as the lower and upper limits.

<<Outline of Organic Electroluminescent Element of Present Invention>>

An organic electroluminescent element (hereinafter also referred to as "organic EL element") of the present invention is an organic electroluminescent element having, between an anode and a cathode in a pair, at least one or more organic functional layers. The organic electroluminescent element has an organic functional layer that exists as a continuous phase over the entire display area, and contains a light emitting compound with a concentration gradient in the in-plane direction and thickness direction of the organic functional layer.

Here, the "organic functional layer that exists as a continuous phase over the entire display area" means, for example, that the host compound constituting the light emitting layer of the organic EL element exists as a continuous solid phase (a solid phase in which the chemical composition and physical state are overall and substantially uniform) over the entire surface of the light emitting region of the light emitting layer.

Also, containing "a light emitting compound with a concentration gradient" means that the light emitting compound is intermittently (for example, in the form of dots or islands) attached to or contained in a non-uniform concentration at each microscopic location that constitutes the surface of the organic functional layer.

From the viewpoint of expressing the effect of the present invention, in an embodiment of the present invention, it is preferable that the organic functional layer preferably has a maximum luminance in the in-plane direction that is more than twice a minimum luminance in the in-plane direction.

Also, in the in-plane direction, it is preferred that the light emitting compound preferably exists in a shape of dots in the in-plane direction from the viewpoint of reproducibility and accuracy of even luminance. Furthermore, in the case of multi-color light emission, the light emitting compound preferably includes multiple types of different light emitting compounds.

Hereinafter, each component of the present invention will be described in detail one by one.

<<Constituent Layers of Organic EL Element>>

Figure 6A:
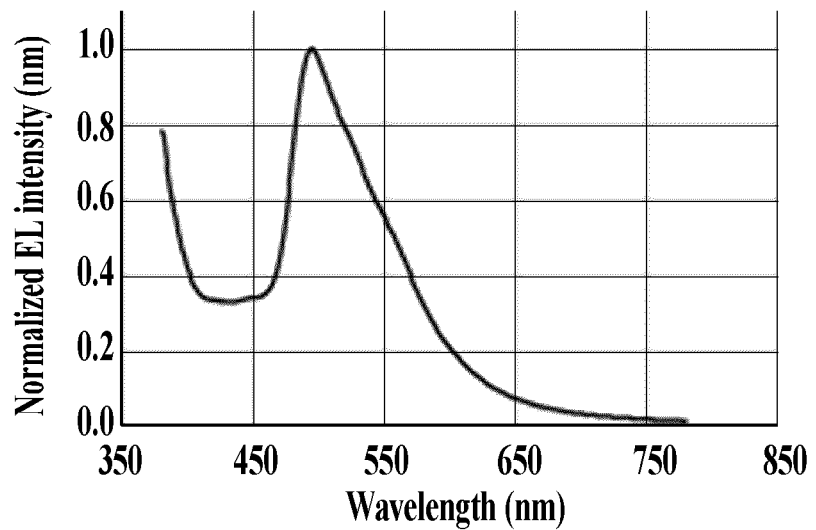
FIGS. 6A and 6B are diagrams showing a spectral emission distribution (A) and a microscopic photograph (B) of an organic EL element upon voltage application.
Figure 6B:
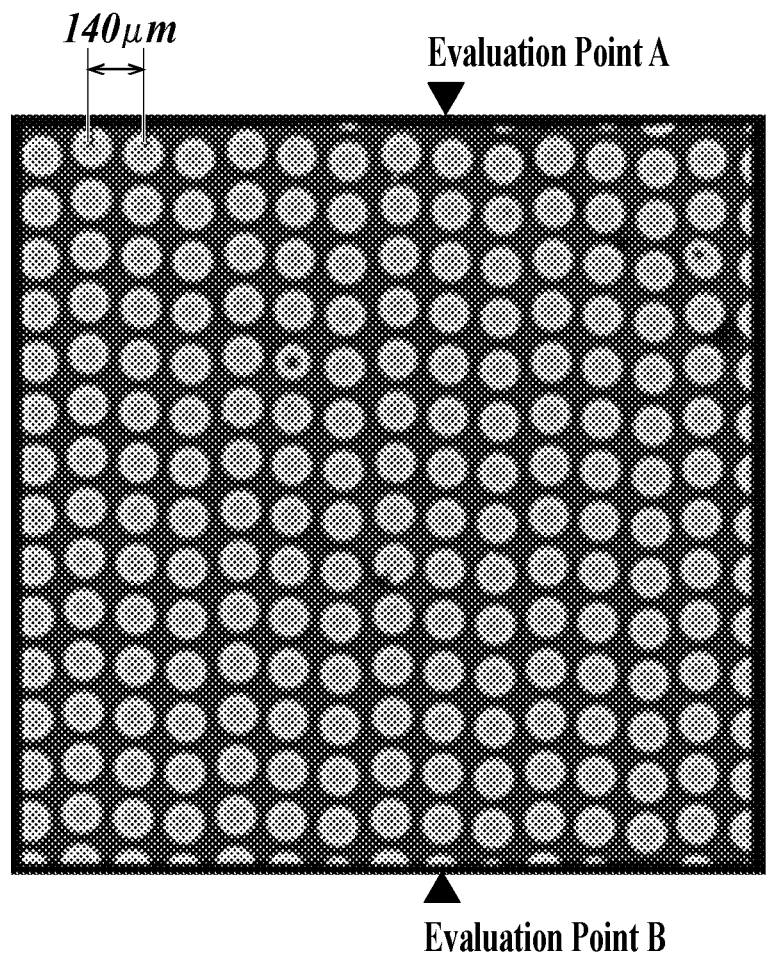

In the descriptions of the various constituent layers below, "the emitter dot layer" refers, for example, to a layer formed on the surface of the organic functional layer, made up of a set of point (dot)-shaped areas (domains) containing at least a light emitting compound (emitter) as a main component as shown in FIG. 6B. However, each point (dot) shaped area may also be referred to as an emitter dot layer, as appropriate.

A layer that contains at least a light emitting compound as a main component and is formed as a continuous phase is referred to as an "emitter layer."

The "host layer" refers to a layer that contains at least a host compound as a main component.

Examples of various layer configurations are shown below.

(i) Anode/Light Emitting Layer (Host Layer A/Emitter Dot Layer/Host Layer B)/Cathode (ii) Anode/Hole Injecting Layer/Light Emitting Layer (Host Layer A/Emitter Dot Layer/Host Layer B)/Electron Injecting Layer/Cathode (iii) Anode/Hole Injecting Layer/Hole Transporting Layer/Light Emitting Layer (Host Layer A/Emitter Dot Layer/Host Layer B)/Electron Transporting Layer/Electron Injecting Layer/Cathode (iv) Anode/Hole Injecting Layer/Hole Transporting Layer/(Host Layer A/Electron Blocking Layer/Emitter Dot Layer/Hole Blocking Layer/Host Layer B)/Electron Transporting Layer/Electron Injecting Layer/Cathode <<Organic Functional Layer>>

The term "organic functional layer" refers to a layer containing an organic compound that exhibits a particular function. It is also simply referred to as an "organic compound layer" or an "organic layer."

The organic functional layers constituting the organic EL element of the present invention include, for example, among the above layer configurations, the hole transporting layer, the light emitting layer (including the host layer and the emitter dot layer), and the electron transporting layer. Other constituent layers of the organic EL element, such as the hole injecting layer and the electron injecting layer, are defined as the organic functional layers of the present invention when they contain organic compounds.

Furthermore, when organic compounds are used in an anode buffer layer, a cathode buffer layer, and the like, the anode buffer layer, cathode buffer layer, and the like also form respective organic functional layers.

The organic functional layer also includes a layer containing "organic EL element materials that can be used in the constituent layers of an organic EL element" and the like.

As for the organic EL element of the present invention, preferably, the emission maximum wavelength of blue light emission is within 430 to 480 nm, the emission maximum wavelength of green light emission is within 500 to 550 nm, and the emission maximum wavelength of red light emission is within 600 to 640 nm. A display device using this is preferred.

In the followings, each layer that constitutes the organic EL element of the present invention will be described.

<<Light Emitting Layer>>

The light emitting layer for the present invention is preferably made up of a host layer A, an emitter dot layer, and a host layer B. The host layer A transports electron holes injected from the hole injecting layer to the emitter dot layer, and the host layer B transports electrons injected from the electron injecting layer to the emitter dot layer. As a result, the electrons and electron holes are recombined in the emitter dot layer and emit light. The position of recombination may be in the emitter dot layer or at the interface with the host layer.

The thicknesses of the host layers A and B are not particularly limited, but from the viewpoint of uniformity of the layers, prevention of applying unnecessarily high voltages during emission, and stability improvement of the emission color in relation to the driving current, the thicknesses are preferably adjusted to be within the range of 10 nm to 1 μm, and more preferably within the range of 20 nm to 100 nm.

The host layers A and B can be manufactured by forming a film of the host compounds described below by depositing using known thin-film deposition methods such as vacuum evaporation, spin-coating, casting, LB method, inkjet printing, and the like.

The light emitting layer of the organic EL element of the present invention preferably contains at least one host compound in the host layers (A and B) and at least one light emitting compound (light emitting dopant; such as a phosphorescent emitting dopant or a fluorescent emitting dopants) in the emitter dot layer. A mixture of an electron hole transport material and an electron transporting material, which are described below, may be used.

As the host compound, any of the conventionally known compounds shown below can be used, either alone or in combination. By using multiple host compounds, it is possible to adjust the charge transfer and to enhance the efficiency of the organic EL element.

As conventionally known host compounds, compounds that have electron hole transport ability and electron transporting ability, prevent elongation of emission wavelength, and have a high glass transition temperature (Tg) are preferred.

Furthermore, the host compound is preferably a low molecular weight host compound. When a high molecular weight host compound is used, it is known that the driving voltage generally becomes high (see JP H3-171590 A). The high molecular weight also causes problems in terms of production processes, such as inability to perform vacuum deposition due to the large molecular weight, restrictions in inkjet printing or dispensing due to high viscosity, in a coating process with nozzles.

In the present method, in which a pair of common electrodes is used to generate light with multiple different materials, a high driving voltage is particularly undesirable. This is because the voltage difference to obtain the required luminance becomes large between different materials, leading to the problem of severe unevenness in luminance between the materials.

For the above reasons, the ratio of the low molecular weight host compound to the total host compound is preferably 50% or more, and more preferably 90% or more. When the ratio is 50% or more, the voltage difference can be decreased, and when the ratio is 90% or more, the voltage difference can be almost eliminated. Here, the term "low molecular weight" refers to molecules with a molecular weight of 2000 or less.

Specific examples of the conventionally-known host compound are described in the following documents:

Japanese Unexamined Patent Application Publications No. 2001-257076, No. 2002-308855, No. 2001-313179, No. 2002-319491, No. 2001-357977, No. 2002-334786, No. 2002-8860, No. 2002-334787, No. 2002-15871, No. 2002-334788, No. 2002-43056, No. 2002-334789, No. 2002-75645, No. 2002-338579, No. 2002-105445, No. 2002-343568, No. 2002-141173, No. 2002-352957, No. 2002-203683, No. 2002-363227, No. 2002-231453, No 2003-3165, No. 2002-234888, No. 2003-27048, No. 2002-255934, No. 2002-260861, No. 2002-280183, No. 2002-299060, No. 2002-302516, No. 2002-305083, No. 2002-305084, and No. 2002-308837.

Furthermore, methylated [n] cyclo-meta-phenylene: ("nMe-[n]CMP") and unsubstituted [n]-cyclo-meta-phenylene ("CMP") disclosed in Japanese Unexamined Patent Application Publication No. 2016-32083 are preferred.

Also, chain aromatic compounds represented by the following general formula (1) or (2) are preferred.

[Chem. 1]

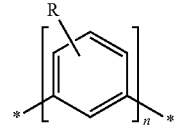

General formula (1)

[In the general formula (1), n represents an integer from 5 to 20. R represents a substituent or a hydrogen atom, and at least one R is a substituent. When R exists more than two, each R may be different. When R is a substituent, the position of each substituent may be different.]

[Chem. 2]

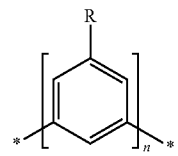

General formula (2)

[In the general formula (2), n represents an integer from 5 to 20. R represents a substituent or a hydrogen atom, and at least one R is a substituent. When R exists more than two, each R may be different.]

Examples of the substituent represented by R in the above general formulae (1) and (2) include an alkyl group (for example, a methyl group, an ethyl group, a propyl group, an isopropyl group, a tert-butyl group, a pentyl group, a hexyl group, an octyl group, a dodecyl group, a dodecyl group, a tridecyl group, a tetradecyl group, and a pentadecyl group), a cycloalkyl group (for example, a cyclopentyl group and a cyclohexyl group), an alkenyl group (for example, a vinyl group, an allyl group, a 1-propenyl group, a 2-butenyl group, a 1,3-butadienyl group, a 2-pentenyl group, and an isopropenyl group), and an alkynyl group (for example, an ethynyl group and a propargylic group).

Also, an aromatic hydrocarbon group (also referred to as an aromatic hydrocarbon ring group, an aromatic carbon ring group, or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group, and the like) and the like are included.

Also, an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolynyl group, a diazacarbazolyl group (indicating a group in which any one of the carbon atoms constituting the carboline ring of the carbolynyl group is substituted with a nitrogen atom), a phthalazinyl group, and the like) and a heterocyclic group (for example, a pyrrolidyl group, an imidazolidyl group, a morphoryl group, an oxazolidyl group, and the like) am included.

Also, an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), and a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group) are included.

Also, an acyl group (for example, an acetyl group, an ethyl carbonyl group, a propylcarbonyl group, a pentylcarbonyl group, a cyclohexylcarbonyl group, an octylcarbonyl group, a 2-ethylhexylcarbonyl group, a dodecycarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecycarbonyloxy group, a phenylcarbonyloxy group, an acryloyl group, and a methacryloyl group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), and a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group) are included.

Also, an ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group, and a dodecylsulfonyl group), an arylsulfonyl group, and a heteroarylsulfonyl group (for example, a phenylsulfonyl group, a naphthylsulfonyl group, and a 2-pyridylsulfonyl group) are included.

Also, an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoromethyl group, and a pentafluorophenyl group), a cyano group, a nitro group, a hydroxy group, a mercapto group, a silyl group (for example, a trimethylsilyl group, a triisopropylsilyl group, a triphenylsilyl group, and a phenyldiethylsilyl group), a phosphono group, a boronic acid group, a boronic ester group, and a borane group are included.

In the aromatic compounds in chain form represented by the above general formula (1) and general formula (2), R is preferably an alkyl group or a hydrogen atom. In particular, all Rs are preferably either alkyl groups or hydrogen atoms, and more preferably either methyl groups or hydrogen atoms. Furthermore, all Rs are preferably alkyl groups, more preferably methyl groups or ethyl groups, and even more preferably methyl groups, and even more preferably all Rs are methyl groups.

Compounds 1 to 38 are shown below as the specific examples of the aromatic compounds in cyclic form represented by the above general formula (I). In the following, Me is a methyl group and Et is an ethyl group.

[Chem. 3]

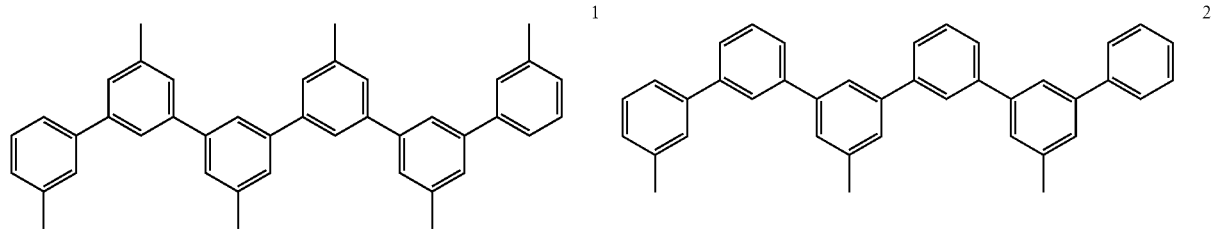

-continued
3
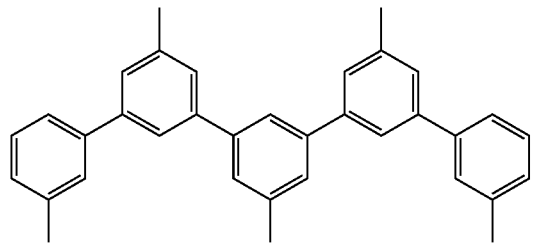
4
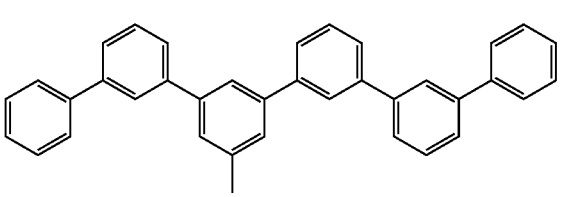
5
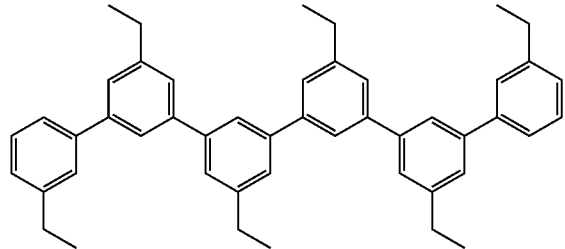
6
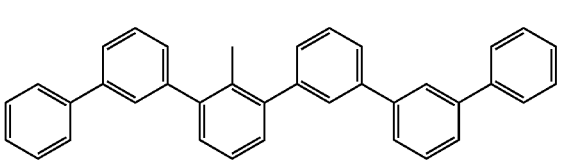
7
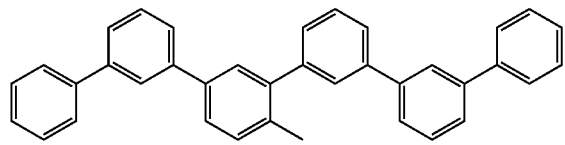
8
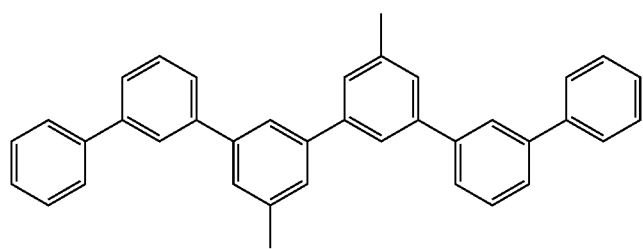
9
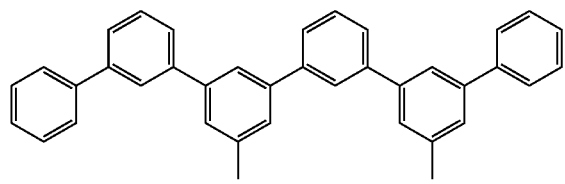
[Chem. 4]
10
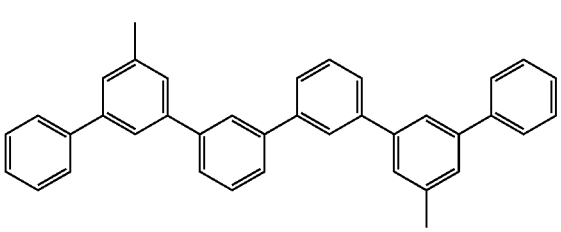
11
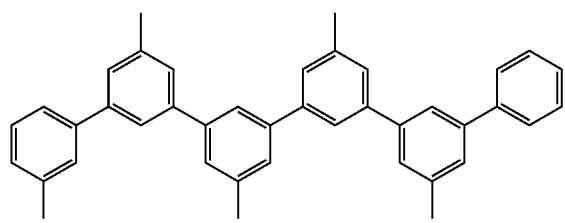
12
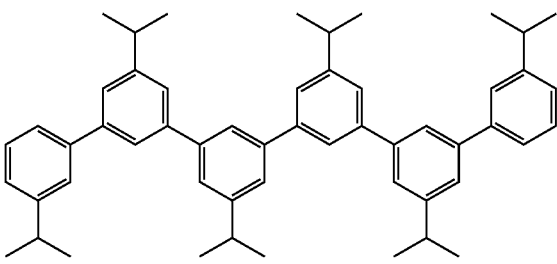
13

-continued
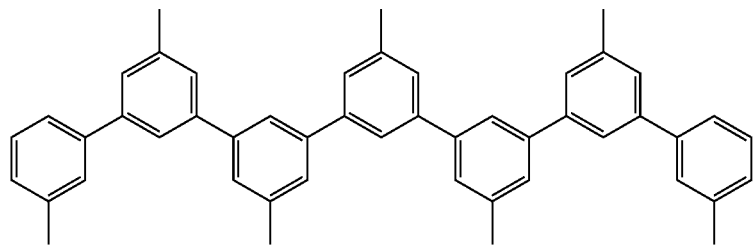
14
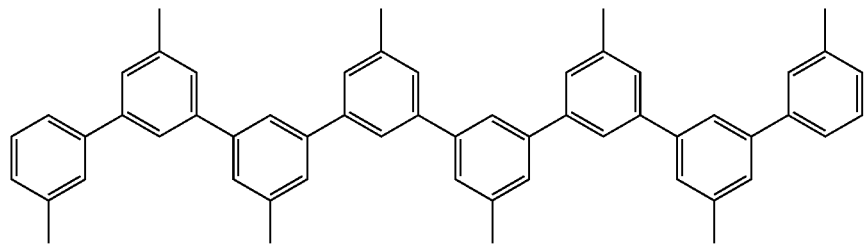
15
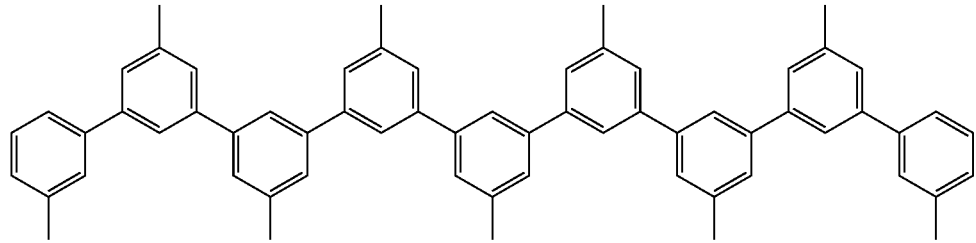
16
[Chem. 5]
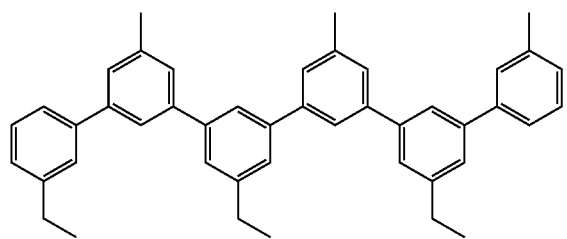
17
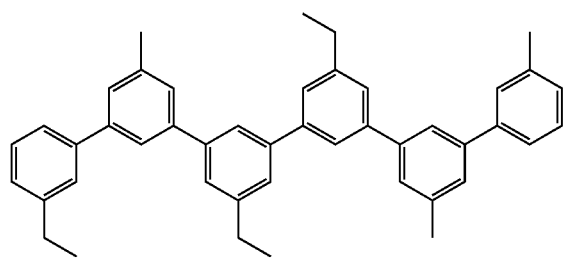
18
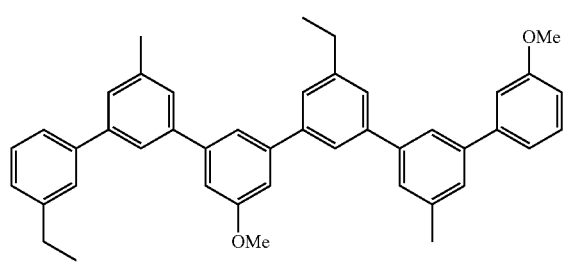
19
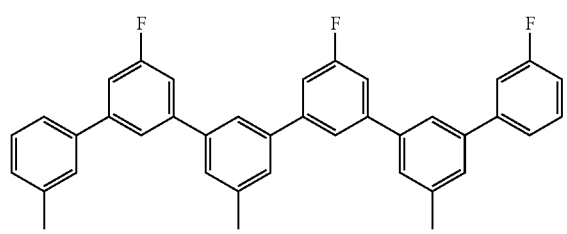
20
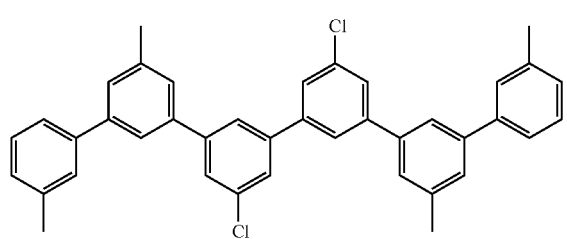
21
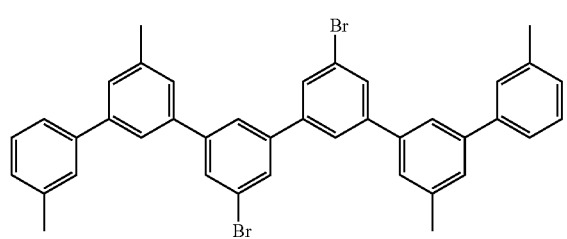
22

-continued
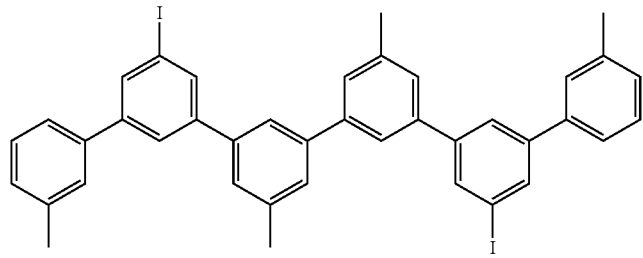
23
[Chem. 6]
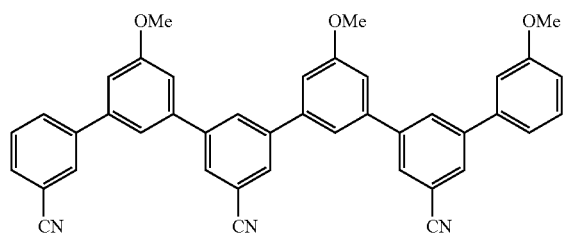
24
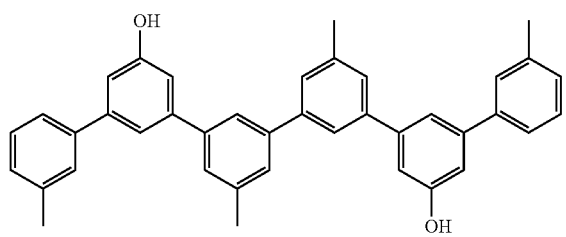
25
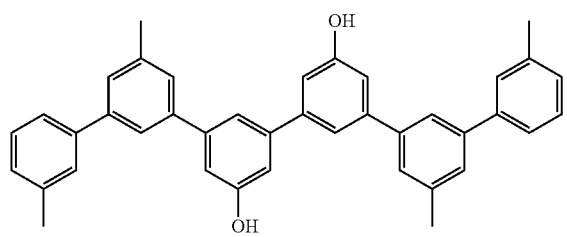
26
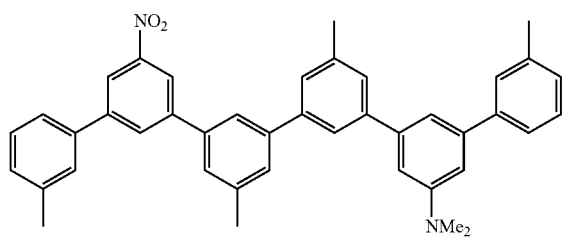
27
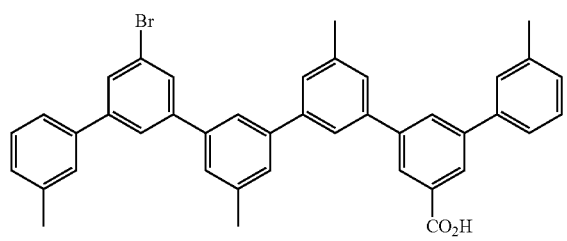
28
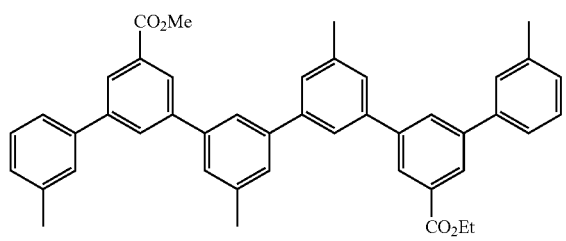
29
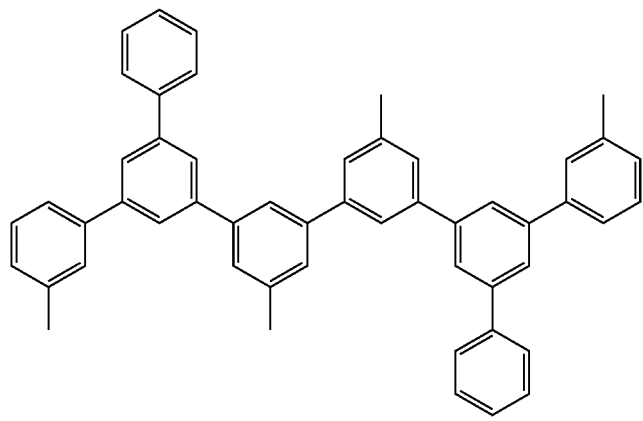
30

[Chem. 7]
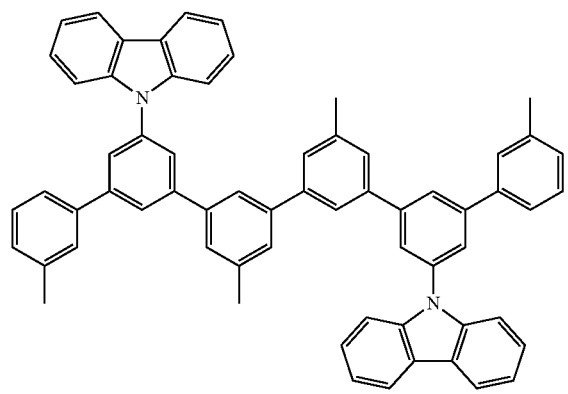
31
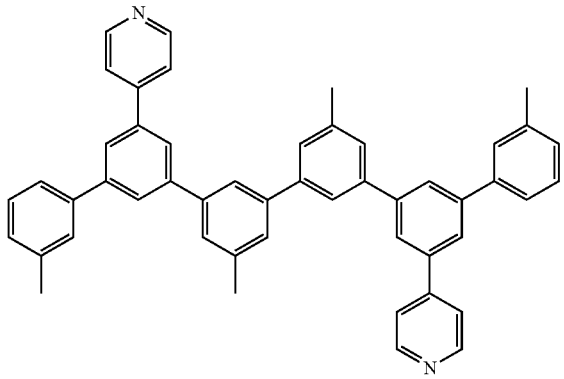
32
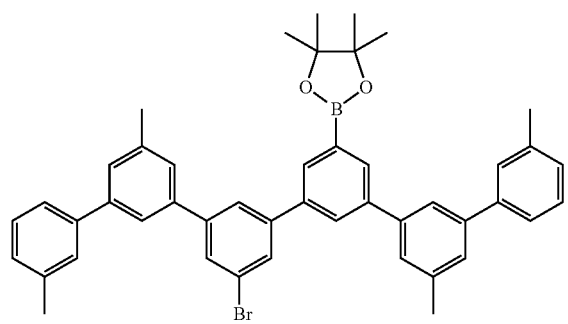
33
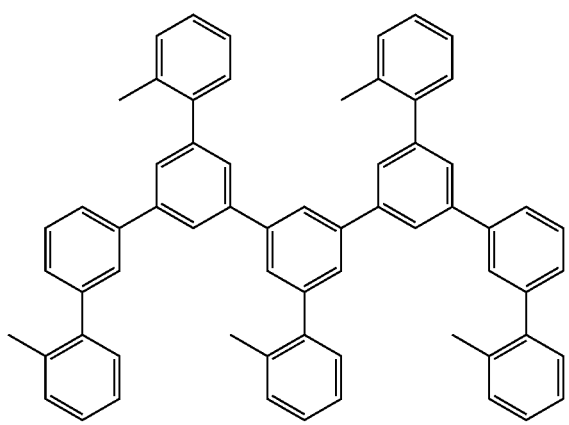
34
[Chem. 8]
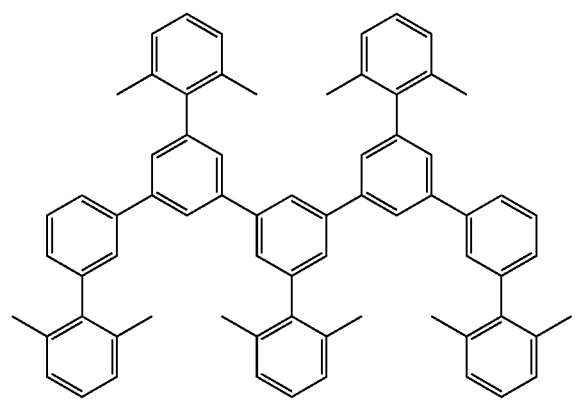
35
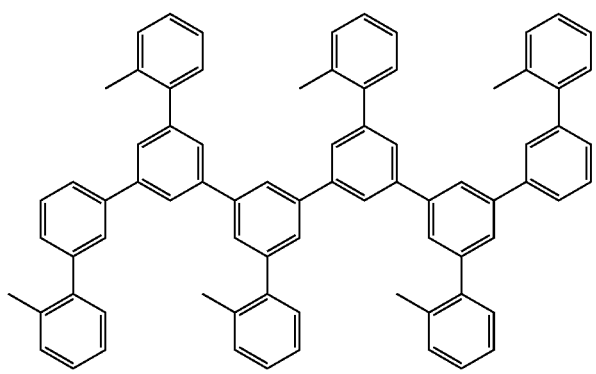
36

-continued

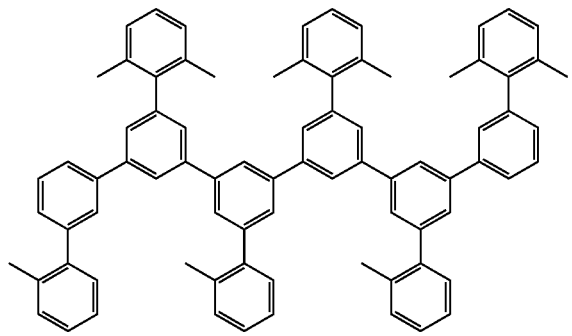

37

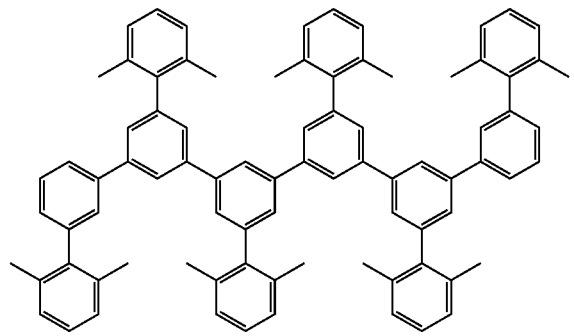

38

(Light Emitting Compound)

As the light emitting compound (also referred to as an "emitter" or a "light emitting dopant"), a fluorescent emitting compound (also referred to as an "fluorescent compound" or a "fluorescent dopant") and a phosphorescent emitting compound (also referred to as an "phosphorescent compound" or a "phosphorescent dopant") can be used.

The phosphorescent emitting compound according to the present invention is a compound where observed emission is from an excited triplet state thereof. Specifically, it is a compound which emits phosphorescence at room temperature (25° C.) and exhibits a phosphorescence quantum yield of 0.01 or more at 25° C. The phosphorescence quantum yield is preferably 0.1 or more.

The phosphorescence quantum yield can be determined using a method described on page 398 of "Spectroscopy II" of "4th Edition Lecture of Experimental Chemistry 7" (1992, published by Maruzen Co. Ltd.). The phosphorescence quantum yield in a solution can be determined using various solvents. It is only necessary for the phosphorescent emitting compound of the present invention to exhibit the above phosphorescence quantum yield (0.01 or more) using any one of the solvents.

There are two types of principles regarding light emission of the light emitting compound. One is an energy transfer-type, in which carriers recombine on a host compound where the carriers are transported to produce an excited state of the host compound, and then, via transfer of this energy to the light emitting compound, light emission from the light emitting compound is realized. The other is a carrier trap-type, in which the light emitting compound serves as a carrier trap where carriers recombine, and light emission from the light emitting compound is realized.

In either case, an energy level of the phosphorescent dopant in the excited state needs to be lower than that of the host compound.

A light emitting compound may be suitably selected and used from known materials used for a light emitting layer of an organic EL element.

(Phosphorescent Emitting Compound)

A phosphorescent emitting compound (also referred to as a "phosphorescent compound" or "phosphorescent dopant") according to the present invention is preferably a complex compound containing a metal of group 8 to 10 in the periodic table, more preferably an iridium compound (Ir complex), an osmium compound, a platinum compound (platinum complex compound), or a rare earth complex, most preferably an iridium compound (Ir complex).

As the phosphorescent emitting compound according to the present invention, a compound having the structure represented by the following general formula (3) is preferably used.

<<Phosphorescent Emitting Compound Having Structure Represented by General Formula (3)>>

[Chem. 9]

General formula (3)

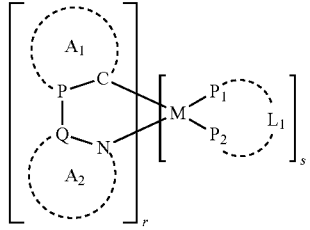

Examples of the aromatic hydrocarbon ring represented by $A_1$ in the general formula (3) include a benzene ring, a biphenyl ring, a naphthalene ring, an azulene ring, an anthracene ring, phenanthrene ring, a pyrene ring, a crycene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, and an anthanthrene ring. These rings may further have substituents described below.

Examples of the aromatic heterocyclic ring represented by $A_1$ in the general formula (3) include a furan ring, a thiophene ring, an oxazole ring, a pyrrole ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, an indazole ring, a benzoimidazole ring, a benzothiazole ring, a benzoxazole ring, a quinoxaline ring, a quinazoline ring, a cynoline ring, a quinoline ring, an isoquinoline ring, a phthalazine ring, a naphthyridine ring, a carbazole ring, a carboline ring, a diazacarbazole ring (a ring in which one of the carbon atoms constituting a carboline ring is further substituted with a nitrogen atom), and the like. These rings may further have substituents described below.

<Substituent>

Examples of the substituent that may be possessed by the aromatic hydrocarbon ring or the aromatic heterocycle ring represented by above A1 include an alkyl group (such as a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a cycloalkyl group (such as a cyclopentyl group and a cyclohexyl group); an alkenyl group (such as a vinyl group and a allyl group), and an alkynyl group (such as an ethynyl group and a propargyl group).

Examples of the substituent also include an aromatic hydrocarbon group (also referred to as an aromatic hydrocarbon ring group, an aromatic carbon ring group, or an aryl group, such as a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenyryl group).

Examples of the substituent also include: an aromatic heterocyclic ring group (such as a pyridyl group, a pyrimidinyl group, a furyl group, a pyrrolyl group, an imidazolyl group, a benzoimidazolyl group, a pyrazolyl group, a pyrazinyl group, a triazolyl group (for example, a 1,2,4-triazol-1-yl group and a 1,2,3-triazol-1-yl group), an oxazolyl group, a benzoxazolyl group, a thiazolyl group, a isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group ((indicating a group in which any ore of the carbon atoms constituting the carboline ring of the carbolynyl group is substituted with a nitrogen atom), a quinoxalinyl group, a pyridazinyl group, a triazinyl group, a quinazolinyl group, and a phthalazinyl group); and a heterocyclic ring group (such as a pyrrolidyl group, an imidazolidyl group, a morpholyl group, and an oxazolidyl group).

Examples of the substituent also include: an alkoxy group (such as a methoxy group, an ethoxy group, a propyloxy group, a pentyloxy group, a hexyloxy group, an octyloxy group, and a dodecyloxy group); a cycloalkoxy group (such as a cyclopentyloxy group and a cyclohexyloxy group); an aryloxy group (such as a phenoxy group and a naphthyloxy group); an alkylthio group (such as a methylthio group, an ethylthio group, a propylthio group, a pentylthio group, a hexylthio group, an octylthio group, and a dodecylthio group); a cycloalkylthio group (such as a cyclopentylthio group and a cyclohexylthio group); an arylthio group (such as a phenylthio group and a naphthylthio group); an alkoxycarbonyl group (such as a methyloxycarbonyl group, an ethyloxycarbonyl group, a butyloxycarbonyl group, an octyloxycarbonyl group and a dodecyloxycarbonyl group); an aryloxycarbonyl group (such as a phenyloxycarbonyl group and a naphthyloxycarbonyl group); and a sulfamoyl group (such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group).

Examples of the substituent also include: an acyl group (such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (such as an acetyloxy group, an ethylcarbonyloxy group, a butylcarbonyloxy group, an octylcarbonyloxy group, a dodecylcarbonyloxy group, and a phenylcarbonyloxy group); an amido group (such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); and a carbamoyl group (such as an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group).

Examples of the substituent also include: an ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group, and a dodecylsulfonyl group), an arylsulfonyl group, a heteroarylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group, and a pentafluorophenyl group), a cyano group, a nitro group, a hydroxy group, a mercapto group, a silyl group (for example, a trimethylsilyl group, a triisopropylsilyl group, a triphenylsilyl group, and a phenyldiethylsilyl group), and a phosphono group.

These substituents may be further substituted with the substituent(s) mentioned above. These substituents may combine with each other to form a ring.

In the general formula (3), the aromatic hydrocarbon ring and the aromatic heterocyclic ring represented by $A_2$ respectively correspond to the aromatic hydrocarbon ring and the aromatic heterocyclic ring represented by $A_1$, in the general formula (10).

In the general formula (3), examples of a bidentate ligand represented by $P_1$-$L_1$-$P_2$ include substituted or unsubstituted phenylpyridine, phenylpyrazole, phenylimidazole, phenyltriazole, phenyltetrazole, pyrazabole, acetylacetone, and picolinic acid.

In the general formula (3), $M_1$ represents a transition metal element (also simply referred to as a "transition metal") of Groups 8 to 10 in the periodic table and is preferably indium or platinum, particularly preferably indium.

Specific examples of the compound used as the phosphorescent emitting compound are shown below, but the present invention is not limited thereto. These compounds can be synthesized by, for example, the method described in Inorg. Chem., vol. 40, 1704-1711.

(Fluorescent Emitting Compound)

The fluorescent emitting compound (also referred to as a "fluorescent compound" or a "fluorescent dopant") include coumarin dyes, pyran dyes, cyanine dyes, chloconium dyes, squarylium dyes, oxobenzanthracene dyes, fluorescein dyes, rhodamine dyes, pyrylium dyes, perylene dyes, stilbene dyes, polythiophene dyes, and ram earth fluorescent complexes.

<<Injecting Layer: Electron Injecting Layer, Hole Injecting Layer>>

The injecting layers include an electron injecting layer and a hole injecting layer and may be disposed between the anode and the light emitting layer or the hole transporting layer and between the cathode and the light emitting layer or the electron transporting layer, as described above.

The "injecting layer" is provided between an electrode and an organic functional layer in order to reduce the driving voltage and to improve the luminance and is described in detail in "Electrode material", Div. 2 Chapter 2 (pp. 123-166) of "Organic EL element and its frontier of industrialization" (published by NTS Corporation. Nov. 30, 1998). The injecting layers are classified into a hole injecting layer (anode buffer layer) and an electron injecting layer (cathode buffer layer).

The "hole injecting layer" is also described in detail in Japanese Patent Laid-Open Application Publications No. Hei9-45479, No. Hei9-260062, No. Hei8-288069, and the like, and specific examples thereof include a phthalocyanine buffer layer that is typically a copper phthalocyanine layer, an oxide buffer layer that is typically a vanadium oxide layer, an amorphous carbon buffer layer, and a high molecular weight buffer layer employing an electroconductive macromolecule such as polyaniline (emeraldine) or polythiophene.

The "electron injecting layer" is also described in detail in Japanese Patent Laid-Open Application Publications Nos. Hei6-325871, Hei9-17574, Hei10-74586, and the like, and specific examples thereof include a metal buffer layer as typified by a strontium or aluminum layer, alkali metal compound buffer layers that is typically a lithium fluoride layer, an alkali earth metal compound buffer layer that is typically a magnesium fluoride layer, and an oxide buffer layer that is typically an aluminum oxide. The injecting layer is desirably a very thin film and preferably has a thickness in a range of 0.1 to 10 nm depending on the material.

<<Blocking Layer: Hole Blocking Layer, Electron-Blocking Layer>>

The "blocking layer" is provided as needed. Examples of the blocking layer include a hole blocking layer described in Japanese Patent Laid-Open Application Publication Nos. Hei11-204258 and Hei11-204359 and on page 237 of "Organic EL element and its frontier of industrialization" (published by NTS Corporation. Nov. 30, 1998), for example.

The "hole blocking layer" functions as an electron transporting layer in abroad sense and is composed of an electron hole blocking material having electron transporting property but extremely poor electron hole transporting property. The hole blocking layer can increase the probability of recombination of electrons and electron holes by transporting electrons and blocking electron holes.

The configuration of an electron transporting layer described below can be applied to the hole blocking layer according to the present invention as needed.

The hole blocking layer of the organic EL element of the present invention preferably adjoins the emitting dot layer.

The configuration of a hole transporting layer described below can be applied to the electron blocking layer as needed. The hole blocking layer and the electron transporting layer according to the present invention each preferably has a thickness of 3 to 100 nm, and more preferably 5 to 30 nm.

<<Hole Transporting Layer>>

The "hole transporting layer" is composed of an electron hole transporting material having electron hole transporting property. The hole transporting layer also includes the hole injecting layer and the electron blocking layer in a broad sense. One or more of the hole transporting layer may be provided. In the organic EL element of the present invention, the hole transporting layer is provided between the host layer A and the hole injecting layer.

The electron hole transporting material has injecting or transporting property of electron holes or electron-blocking property and may be either an organic material or an inorganic material. Examples of the electron hole transporting material include a triazole derivative, an oxadiazole derivative, an imidazole derivative, a polyarylalkane derivative, a pyrazoline derivative, a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive high molecular weight oligomer, and particularly a thiophene oligomer and the like. As the electron hole transporting material, those described above can be used, but preferred are a porphyrin compound, an aromatic tertiary amine compound, a styrylamine compound, and in particular, an aromatic tertiary amine compound.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenyl ether, 4,4'-bis(diphenylamino)quaterphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostylbenzene; and N-phenylcarbazole. Further, a compound having two condensed aromatic rings in a molecule as described in U.S. Pat. No. 5,061,569 such as 4,4'-bis[N-(1-naphthyl)-N-phenylamino]biphenyl (NPD), a compound in which three triphenylamine units are bonded in a starburst form as described in Japanese Patent Laid-Open No. Hei4-308688, such as 4,4',4"-tris[N-(3-methylphenyl)-N-phenylamino]triphenylamine (MTDATA), and the like are included.

High molecular weight materials including the above materials introduced into a macromolecule chain or high molecular weight materials including the above materials as their main chains can also be used. Inorganic compounds such as p-type Si and p-type SiC can also be used as the electron hole injecting material or the electron hole transporting material.

So-called p-type electron hole transporting materials as described in Japanese Patent Laid-Open Application Publication No. Hei11-251067 or in J. Huang, et al., (Applied Physics Letters, 80 (2002), p. 139) can also be used.

In the present invention, it is preferable to use the organic EL element material of the present invention having a polymeric compound represented by the above general formula (1) or a polymeric compound having a structural unit derived from the polymeric compound, because a higher performance light emitting element can be obtained. The above materials may be used in combination.

The hole transporting layer can be formed by preparing a thin film with the above electron hole transporting material by a known method such as vacuum deposition, spin coating, casting, printing including ink-jet printing, or LB method. In the present invention, the hole transporting layer is preferably formed by application (a wet process). The thickness of the hole transporting layer is not particularly limited, is usually about 5 nm to 5 μm, and is preferably 5 to 200 nm. The hole transporting layer may have a monolayer structure composed of one or more of the materials mentioned above.

A hole transporting layer having high p-type properties doped with impurity(ies) can also be used. Examples thereof include those described in, for example, Japanese Patent Laid-Open Application Publications No. Hei4-297076, No. 2000-196140 and No. 2001-102175, and J. Appl. Phys., 95, 5773 (2004).

<<Electron Transporting Layer>>

The "electron transporting layer" is composed of a material having an electron transporting function, and includes the electron injecting layer and the hole blocking layer in abroad sense. One or more of the electron-transporting layers may be provided.

In the organic EL element of the present invention, the electron transporting layer is arranged between the host layer B and the electron injecting layer.

Conventionally, an electron transporting material (also serving as a hole blocking material) contained in the electron transporting layer when one electron-transporting layer is provided or contained in the electron-transporting layer adjoining the light emitting layer on the cathode side when multiple electron-transporting layers are provided may be any material having a function of transporting electrons injected from a cathode to the light emitting layer and may be appropriately selected from known compounds. Examples of the electron transporting material include a nitro-substituted fluorene derivative, a diphenylquinone derivative, a thiopyran dioxide derivative, a carbodiimide, a fluorenylidenemethane derivative, an anthraquinodimethane and anthrone derivative, and an oxadiazole derivative.

Furthermore, a thiadiazole derivative, in which oxygen atoms of the oxadiazole ring of the oxadiazole derivative mentioned above are replaced with sulfur atoms, and a quinoxaline derivative having quinoxaline rings known as electron extracting groups may be used as the electron transporting material. Further, high molecular weight materials including the above materials introduced into a macromolecule chain or high molecular weight materials including the above materials as their main chains can also be used.

Examples of the usable electron-transporting material include a metal complex of an 8-quinolinol derivative such as aluminum tris(8-quinolinol) (Alq), aluminum tris(5,7-dichloro-8-quinolinol), aluminum tris(5,7-dibromo-8-quinolinol), aluminum tris(2-methyl-8-quinolinol), aluminum tris(5-methyl-8-quinolinol), and zinc bis(8-quinolinol) (Znq) and a metal complex in which the central metal of the above metal complex is replaced with In, Mg, Cu, Ca, Sn, Ga or Pb.

In addition, a metal-free or a metal-containing phthalocyanine and its derivative having an end substituted with, for example, an alkyl group or a sulfonic acid group are also preferably used as the electron transporting materials. The distyrylpyrazine derivatives exemplified as materials for the light emitting layer can be preferably used as the electron transporting material. An inorganic semiconductor such as n-type Si and n-type SiC can also be used as the electron transporting material as in the hole injecting layer or the hole transporting layer.

The electron transporting layer may be formed by preparing a thin film with the above-mentioned electron transporting material using a known method such as vacuum deposition, spin coating, casting, printing including inkjet printing or LB method.

The thickness of the electron transporting layer is not particularly limited, is usually about 5 nm to 5 μm, and is preferably 5 to 200 nm. The electron transporting layer may have a monolayer structure composed of one or more of the materials mentioned above.

An electron transporting layer doped with impurity(ies) so as to have a high n-type property can be used. Examples thereof include those described in, for example, Japanese Patent Laid-Open Application Publications No. Hei4-297076, No. Hei10-270172, No. 2000-196140, and No. 2001-102175, and J. Appl. Phys., 95, 5773 (2004).

<<Anode>>

The electrode material of the anode of the organic EL element is preferably a metal, an alloy, or an electroconductive compound having a high work function (4 eV or more) or a mixture thereof.

Specific examples of the electrode material include a metal such as Au and a transparent electroconductive material such as CuI, indium tin oxide (ITO), $SnO_2$, and ZnO.

A material that is amorphous and capable of forming a transparent electroconductive film such as IDIXO ($In_2O_3$—ZnO) may be used.

The anode may be produced by forming a thin film of the electrode material using a method such as deposition or sputtering and then patterning the layer into a desired shape by photolithography. If required precision of the pattern is not so high (about 100 μm or more), the pattern may be formed by depositing or sputtering the electrode material through a mask having a desired shape. Alternatively, if an applicable material such as an organic electroconductive compound is used, a wet film forming method such as printing or coating can also be used.

For extracting emitted light from the anode, the transmittance of the anode is desirably 10% or more, and the sheet resistance of the anode is preferably several hundred Ω/□ or less. The thickness of the layer is usually in a range of 10 to 1000 nm, and preferably 10 to 200 nm, depending on the material.

<<Cathode>>

On the contrary, an electrode material used as the cathode is a metal having a low work function (4 eV or less) (referred to as an electron injecting metal), alloy, an electroconductive compound having a low work function (4 eV or less), or a mixture thereof. Specific examples of the electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare-earth metal.

Among them, mixtures of an electron injecting metal and a second metal having a work function higher than that of the electron injecting metal and being stable, such as magnesium/silver mixtures, magnesium/aluminum mixtures, magnesium/indium mixtures, aluminum/aluminum oxide ($Al_2O_3$) mixtures, lithium/aluminum mixtures, and aluminum are preferred from the view point of the electron injecting property and resistance to oxidation. The cathode can be manufactured by forming a thin film with the electrode material using a method such as deposition or sputtering.

The cathode preferably has a sheet resistance of several hundred Ω/□ or less and a thickness in a range of usually 10 nm to 5 μm, and preferably 50 to 200 nm. When either the anode or the cathode of the organic EL element is transparent or translucent, the emitted light is transmitted through it, which is preferably for increasing the luminance.

A transparent or translucent cathode can be manufactured by forming a film of the above metal having a thickness of 1 to 20 nm and then providing a layer of an electroconductive transparent material exemplified in the description of the anode on the metal layer. Application of this process can manufacture an element having a transparent anode and transparent cathode.

<<Supporting Substrate>>

A supporting substrate (also referred to as a base body, a substrate, a base, or a support) that can be used for the organic EL element of the present invention may be composed of any material such as glass or plastic and may be transparent or opaque. In the case of extracting light from the supporting substrate side, the supporting substrate is preferably transparent.

Examples of the supporting substrate preferably used include glass, quartz, and transparent resin films. A particularly preferred supporting substrate is a resin film capable of imparting flexibility to the organic EL element.

Examples of the resin film include a film of a polyester such as polyethylene terephthalate (PET) and polyethylene naphthalate (PEN), polyethylene, polypropylene, cellophane, a cellulose ester and its derivative such as cellulose diacetate, cellulose triacetate, cellulose acetate butyrate, cellulose acetate propionate (CAP), cellulose acetate phthalate (TAC) and cellulose nitrate, polyvinylidene chloride, polyvinyl alcohol, polyethylene vinyl alcohol, syndiotactic polystyrene, polycarbonate, a norbornene resin, polymethylpentene, a polyether ketone, a polyimide, polyether sulfone (PES), polyphenylene sulfide, polysulfones, polyether imide, polyether ketone imide, a polyamide, a fluorine resin, nylon, polymethyl methacrylate, acrylic, a polyarylate, and a cycloolefin resin such as ARTON (trade name, manufactured by JSR Corp.) and APEL (trade name, manufactured by Mitsui Chemicals Inc.).

On the surface of the resin film, an inorganic film, an organic coating film, or a hybrid coating film including both of them may be formed. The coating film is preferably a barrier film having a vapor permeability of 0.01 $g/(m^2 \cdot 24\ h)$ or less (at 25±0.5° C. and 90±2% relative humidity (RH)) measured by a method in accordance with JIS K 7129-1992, and more preferably a high barrier film having an oxygen permeability of $10^{-3}$ $mL/(m^2 \cdot 24\ h \cdot MPa)$ or less and a vapor permeability of $10^{-5}$ $g/(m^2 \cdot 24\ h)$ or less measured by a method in accordance with JIS K 7126-1987.

The barrier film may be formed with any material that can prevent penetration of substances such as moisture and oxygen that cause degradation of the element, and usable examples of the material include silicon oxide, silicon dioxide, and silicon nitride. In order to further reduce the fragility of the film, a barrier film having a laminate structure composed of an inorganic layer and an organic material layer is preferred.

The inorganic layer and the organic functional layer may be laminated in any order, and are preferably laminated alternately multiple times.

The barrier film may be formed by any method without particular limitation. For example, vacuum deposition, sputtering, reactive sputtering, molecular beam epitaxy, ionized-cluster beam deposition, ion plating, plasma polymerization, atmospheric pressure plasma polymerization, plasma CVD, laser CVD, thermal CVD, or coating may be used, and atmospheric pressure plasma polymerization as described in Japanese Patent Laid-Open Application Publication No. 2004-68143 is particularly preferred.

Examples of the opaque supporting substrate include a metal plate such as an aluminum and stainless steel plate; a film, an opaque resin substrate, and a ceramic substrate.

The light extraction efficiency of the organic EL element of the present invention at room temperature is preferably 1% or more, and more preferably 5% or more.

The quantum extraction efficiency (%) is defined as (the number of photons emitted to the exterior from the organic EL element)/(the number of electrons supplied to the organic EL element)×100.

A hue improving filter such as a color filter may be used in combination, or a color conversion filter that converts the color of light emitted by the organic EL element to various colors using fluorescent compounds may be used in combination. In the case of using the color conversion filter, the λmax of the light emitted by the organic EL element is preferably 480 nm or less.

<<Sealing>>

Examples of the sealing method used in the present invention include a method of bonding a sealing member to the electrode and the supporting substrate with an adhesive.

The sealing member is disposed so as to cover a display area of the organic EL element and may have a concave plate shape or a flat plate shape. The transparency and the electrical insulation properties thereof are not particularly restricted.

Specific examples of the sealing member include a glass plate, a polymer plate and a film, and a metal plate and a film. Examples of the glass plate include a plate of soda-lime glass, barium/strontium-containing glass, lead glass, aluminosilicate glass, borosilicate glass, barium borosilicate glass, and quartz. Examples of the polymer plate include a polycarbonate plate, an acryl resin plate, a polyethylene terephthalate plate, a polyether sulfide plate, and a polysulfone plate. Examples of the metal plate include a metal or alloy plate of at least one selected from the group consisting of stainless steel, iron, copper, aluminum, magnesium, nickel, zinc, chromium, titanium, molybdenum, silicon, germanium, tantalum, and alloys thereof.

In the present invention, a polymer film or a metal film is preferably used from the viewpoint of reducing the film thickness of the element. The polymer film preferably has an oxygen permeability of $10^{-3}$ $mL/(m^2 \cdot 24\ h \cdot MPa)$ or less measured by a method in accordance with JIS K 7126-1987 and a vapor permeability of $1 \times 10^{-3}$ $g/(m^2 \cdot 24\ h)$ or less (at 25±0.5° C. and 90±2% relative humidity (RH)) measured by a method in accordance with JIS K 7129-1992.

The sealing member is formed into a concave shape by, for example, sand blasting or chemical etching.

Specific examples of the adhesive include a photo-curable or thermo-curable adhesive having a reactive vinyl group such as an acrylic acid oligomer and a methacrylic acid oligomer, and a moisture curable adhesive such as 2-cyanoacrylate.

Examples of the adhesive include a thermally or chemically curable adhesive (two liquid mixture) such as an epoxy type adhesive; hot-melt type polyamide, polyester, polyolefin; and a cation curing type UV curable epoxy resin adhesive.

Since the organic EL element may be degraded by heat treatment, an adhesive that is cured at a temperature from room temperature to 80° C. is preferably used A drying agent may be dispersed in the adhesive. Application of the adhesive to the adhering portion may be performed with a commercially available dispenser or may be performed by printing such as screen printing.

It is also preferred that an inorganic or organic layer is formed as a sealing film on the outer side of the electrode placed on the side facing the supporting substrate and sandwiching the organic layer therebetween so as to cover the electrode and the organic layer and to be contact with the supporting substrate. In such a case, the sealing film may be formed with any material such as silicon oxide, silicon dioxide, and silicon nitride, as long as it can prevent penetration of substances such as water and oxygen causing degradation of the element. In order to reduce the fragility of the film, a sealing film having a laminate structure composed of an inorganic layer and an organic material layer is preferred.

The above film may be formed by any method without particular limitation. For example, vacuum deposition, sputtering, reactive sputtering, molecular beam epitaxy, ionized-cluster beam deposition, ion plating, plasma polymerization, atmospheric pressure plasma polymerization, plasma CVD, laser CVD, thermal CVD or coating may be employed.

In a space between the sealing member and the display area of the organic EL element, in a gas or liquid phase, it is preferable that an inactive gas such as nitrogen or argon or an inactive liquid such as fluorinated hydrocarbon or silicone oil is injected. The space can be in a vacuum state. Alternatively, a hygroscopic compound may be enclosed inside.

Examples of the hygroscopic compound include a metal oxide (such as sodium oxide, potassium oxide, calcium oxide, barium oxide, magnesium oxide, and aluminum oxide), a sulfate (such as sodium sulfate, calcium sulfate, magnesium sulfate, and cobalt sulfate), a metal halide (such as calcium chloride, magnesium chloride, cesium fluoride, tantalum fluoride, cerium bromide, magnesium bromide, barium iodide, and magnesium iodide), and a perchloric acid (such as barium perchlorate and magnesium perchlorate). As for the sulfate, the metal halide, and the perchlorate, anhydrides thereof are preferably used.

<<Protective Film, Protective Plate>>

In order to increase mechanical strength of the element, a protective film or a protective plate may be provided on the outer surface of the sealing film on the side facing the supporting substrate and sandwiching the organic layer therebetween or on the outer surface of the sealing film.

In particular, when the seal is the sealing film, the mechanical strength of the film is not sufficiently high, and such a protective film or plate is preferably provided. Usable examples of the material for the protective film or plate include a glass plate, a polymer plate and film, and a metal plate and film exemplified as the materials for sealing. The polymer film is preferably used from the viewpoint of reducing the weight and the thickness.

<<Light Extraction>>

It is generally said that, in an organic EL element, light is generated in a layer whose refractive index (refractive index: about 1.7 to 2.1) is higher than that of air, and only about 15 to 20% of the light generated in the light emitting layer can be extracted.

This is because incident light on an interface (interface between a transparent substrate and the air) at an angle θ larger than a critical angle is totally reflected and cannot be extracted from the element because light is totally reflected at the interface between the transparent electrode or light emitting layer and t transparent substrate and is guided in the transparent electrode or the light emitting layer to be released toward the side face of the element.

Examples of the method for improving the efficiency of light extraction include a method of preventing total reflection at the interface between the transparent substrate and the air by forming a rough surface of the transparent substrate (U.S. Pat. No. 4,774,435); a method of improving the efficiency by providing light-condensing property to the substrate (Japanese Patent Laid-Open Application Publication No. Sho63-314795); a method of forming a reflection surface on the side faces of the element (Japanese Patent Laid-Open Application Publication No. Hei1-220394); a method of providing an anti-reflection film by disposing a smoothing layer between the substrate and the light emitting body, where the smoothing layer has a refractive index level between those of the substrate and the light emitting body (Japanese Patent Laid-Open Application Publication No. Sho62-172691); a method of disposing a smoothing layer between the substrate and the light emitting body, the smoothing layer having a refractive index lower than that of the substrate (Japanese Patent Laid-Open Application Publication No. 2001-202827), and a method of providing a diffraction grating between any layers of the substrate, the transparent electrode layer, and the light emitting layer (or may be provided between the substrate and the exterior) (Japanese Patent Laid-Open Application Publication No. Hei11-283751).

In the present invention, these methods can also be used for the organic EL element of the present invention. In particular, the method of disposing a smoothing layer between the substrate and the light emitting body, the smoothing layer having a refractive index lower than that of the substrate or the method of forming a diffraction grating between any layers of the substrate, the transparent electrode layer, and the light emitting layer (or may be provided between the substrate and the exterior) may be suitably employed.

The present invention can provide an element exhibiting higher luminance or excellent durability by combining these methods.

When a medium having a low refractive index and having a thickness greater than light wavelength is provided between a transparent electrode and a transparent substrate, the extraction efficiency of light from the transparent electrode to the exterior increases with a decrease in the refractive index of the medium.

Examples of the low refractive index layer include aerogel, porous silica, magnesium fluoride, and fluorinated polymer layers. Since the refractive index of a transparent substrate is generally about 1.5 to 1.7, the refractive index of the low refractive index layer is preferably about 1.5 or less, and more preferably 1.35 or less.

The thickness of the low refractive index medium is desirably twice or more of a light wavelength in the medium because, when the low refractive index medium has a thickness near the light wavelength, the electromagnetic wave exuded as an evanescent wave penetrates into the substrate, resulting in a reduction of the effect of the low refractive index layer.

The method of providing a diffraction grating into the interface at which total reflection occurs or into any medium can increase the effect of enhancing the light extraction efficiency.

In this method, a diffraction grating is provided at the interface between any layers or into any medium (in the transparent substrate or the transparent electrode) to diffract and extract the light that is emitted from the light emitting layer but cannot exit due to, for example, total reflection occurring at the interface between the layers, taking advantages of the property of the diffraction grating that can change the direction of light to a specific direction different from that of refraction by Bragg diffraction such as primary diffraction or secondary diffraction.

The diffraction grating to be introduced desirably has a two-dimensional periodic refractive index because light generated in a light emitting layer is emitted randomly in all directions, and thus a common one-dimensional diffraction grating having a periodic refractive index distribution only in a specific direction can diffract only the light proceeding in a specific direction and cannot greatly increase the light extraction efficiency.

The use of a diffraction grating having a two-dimensional refractive index distribution allows diffraction of light proceeding in all directions, which increases efficiency of light extraction.

The diffraction grating may be provided between any layers or into any medium (in the transparent substrate or the transparent electrode) as described above but is desirably provided near an organic light emitting layer where light is generated.

The period of the diffraction grating is preferably about ½ to 3 times the wavelength of light in a medium.

The array of the diffraction grating is preferably a two-dimensionally repeated array such as a square lattice, a triangular lattice, or a honeycomb lattice.

<<Light-Condensing Sheet>>

The organic EL element of the present invention can enhance the luminance in a specific direction by condensing light in a specific direction, for example, in the front direction with respect to the light emitting face of the element by processing to provide, for example, a micro-lens array structure on the light extraction side of the substrate or combining with a so-called light-condensing sheet.

In an example of a micro-lens array, quadrangular pyramids having a side of 30 μm and having a vertex angle of 90 degrees am two-dimensionally arranged on the light extraction side of the substrate. The quadrangular pyramid preferably has a side in the range of 10 to 100 μm. When the length of the side is shorter than this range, the light is colored due to the effect of diffraction, while when it is too long, the thickness is unfavorably large.

As the light-condensing sheet, one practically used in an LED backlight of a liquid crystal display device can be used. Examples of the sheet include a brightness enhancing film (BEF) manufactured by SUMITOMO 3M Inc. The prism sheet may have a shape, for example, triangle-shaped stripes each having a vertex angle of 90 degrees and a pitch of 50 μm, having round apexes, having randomly changed pitches, and other shapes, formed on a base material.

In order to control the emission angle of light from the light emitting element, a light diffusion plate or film may be used in combination with the light-condensing sheet. For example, a diffusion film (Light-Up), manufactured by KIMOTO Co., Ltd., can be used.

<<Method for Producing Organic EL Element>>

The method for producing the organic electroluminescent element of the present invention having at least one or more organic functional layers between an anode and cathode in a pair and is characterized by the following processes 1 and 2 in addition to the step of forming each of an anode and a cathode in a pair. It is also preferred to further have a step 3 as follows.

Step 1: A step of forming an organic functional layer that exists as a continuous phase over the entire display area at least on the electrode surface Step 2: A step of dropping a solution containing a light emitting compound onto the organic functional layer to form an organic functional layer in which the light emitting compound is contained with a concentration gradient Step 3: A step of forming a second organic functional layer on the organic functional layer containing the light emitting compound In the present invention, it is also preferable to have further steps other than the steps described above, depending on the purpose.

It is preferable to drop the solution containing the light emitting compound onto the organic functional layer using the inkjet printing method because small droplets can be formed, bank formation is not required, and the method is simple.

Details of the inkjet printing method are described below.

As an example of a method for producing an organic EL element related to the present invention, a method for producing a device consisting of the anode/hole injecting layer/light emitting layer (host layers A and B, and emitter dot layer)/electron injecting layer/cathode will be described.

First, the anode is manufactured by forming a thin film on an appropriate base body with a desired electrode material, for example, a material for anode, in a thickness of 1 μm or less, preferably 10 to 200 nm.

Next, on the top of this, a layer consisting of thin film such as the hole injecting layer, the light emitting layer, and the electron injecting layer containing organic compounds that are the element materials are formed.

Examples of methods for forming these layers include vapor deposition and coating method (wet deposition). Examples of the coating method include spin coating, casting, die coating, blade coating, roll coating, inkjet printing, printing, spray coating, and curtain coating. Preferred are die coating, roll coating, inkjet printing, and spray coating, which are highly applicable to the roll-to-roll method to form a precise thin film at high productivity. The individual layers may be formed by different film forming processes.

The emitter dot layer is formed between the host layers A and B, preferably in a method that allows for patterning. The forming method may be a printing method using a mask with a patterning aperture, but is preferably a non-contact method from the viewpoint of minimizing damage to the host layer A. Dispensing and inkjet printing methods are more preferable from the viewpoint of achieving high resolution. The volume of the solution containing the emitter is preferably 10 μL or less, and preferably 100 pL or less.

The size of the dots, when measured based on an optical micrograph (plan view) taken from the main light emitting surface of the light emitting layer, is in the range of 30 to 300 μm in diameter as a circle equivalent particle size.

After the formation of these layers, a layer of the cathode material is applied on top of the layers, with the thickness of 1 μm or less, preferably from 50 to 200. By thus providing a cathode, the desired organic EL element is obtained. Alternatively, the order can be reversed, so that the cathode, electron injecting layer, light emitting layer, hole injecting layer, and anode are produced in this order.

When a direct current voltage is applied to the above-obtained multi-color display device, light emission can be observed at the voltage of about 2 to 40 V, with the anode defined as a positive electrode and the cathode as a negative electrode. Alternatively, an alternating voltage may be applied. The alternating current to be applied may have any wave form.

The organic EL element of the present invention is preferably manufactured consistently in a single vacuum drawing from the hole injecting layer to the cathode, except for the emitter dot layer. For the emitter dot layer, which is deposited in atmospheric pressure, the deposition process may be performed under a dry inert gas atmosphere.

When a direct current voltage is applied to the above-obtained multi color display device, light emission can be observed at the voltage of about 2 to 40 V, with the anode defined as a positive electrode and the cathode as a negative electrode. Alternatively, an alternating voltage may be applied. The alternating current to be applied may have any wave form.

For the method of producing an element consisting of the anode/hole injecting layer/hole transporting layer/light emitting layer/electron transporting layer/cathode, the hole transporting layer and the electron transporting layer can be formed in the same way as the hole injecting layer, the light emitting layer, and the electron injecting layer.

[Inkjet Printing Method]

In the production of the organic EL element of the present invention, an inkjet printing method is preferred as a method of forming the emitter dot layer.

In the present invention, known inkjet printing methods and inkjet printing devices can be applied as appropriate.

For example, using an inkjet printhead, an ink containing a light emitting compound (emitter) (phosphorescent or fluorescent light emitting compound) is ejected toward the surface of an organic functional layer (for example, the host layer) formed in advance, under certain dot-forming conditions, to form an emitter dot layer. Specific examples will be explained in detail in the examples of the present invention described below.

Inkjet heads are not particularly limited. For example, it may be a shear-mode (piezo-type) head that has a vibrating plate with a piezoelectric element in an ink pressure chamber and ejects ejected liquid by pressure changes in the ink pressure chamber caused by tins vibrating plate. Alternatively, it may be a thermal type head that has a heating element and ejects the liquid from the nozzle by a rapid volume change caused by film boiling of the ink due to thermal energy from this heating element.

The inkjet head is preferably connected to a mechanism or other device that supplies the liquid to be ejected.

It is preferable to dissolve or disperse a desired amount of the light emitting compound for inkjet printing in a solvent to be used as an ink. For example, the solvent used for an inkjet ink is not particularly limited as long as the desired amount of the above materials can be dispersed and droplets can be ejected from an inkjet nozzle. However, it is preferable that the solvent be selected depending on the type of the light emitting compound and the like.

Specific examples of the solvent are water, alcohols such as methanol, ethanol, propanol, isopropyl alcohol, butanol, hexanol, heptanol, octanol, decanol, cyclohexanol, terpineol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ethers such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, p-dioxane; glycol ether ester compounds such as ethylene glycol monomethyl ether acetate; glycol oligomeric ether esters such as diethylene glycol monomethyl ether acetate, and diethylene glycol monobutyl ether acetate; aliphatic or aromatic esters such as ethyl acetate and propyl benzoate; dicarboxylic acid diesters such as diethyl carbonate; alkoxycarboxylic acid esters such as methyl 3-methoxypropionate and ethyl 3-ethoxypropionate; ketocarboxylic acid esters such as ethyl acetoacetate, and polar compounds such as propylene carbonate, γ-butyrolactone, N-methyl-2-pyrrolidone, dimethylformamide, dimethyl sulfoxide, and cyclohexanone.

Furthermore, in order to make the ink suitable for inkjet printing, various functional additives can be included in the ink prepared by dissolving the constituent materials in ink solvents and the like.

Examples of known additives that may be selected and used include a solvent, a viscosity modifier, a surface tension modifier, a resistivity modifier, a film forming agent, a dispersing agent, a surfactant, an ultraviolet absorber, an antioxidant, an anti-fading agent, a mold inhibitors, and a rust inhibitor, depending on the purpose of ejection stability, print head compatibility, storage stability, image storage stability, and other performance improvements.

Examples of preferred conditions for producing the emitter dot layer by the inkjet printing method are shown below. A commercially available industrial-use inkjet device is desirable. For example, UCS-1 (manufactured by Konica Minolta, Inc.) may be used. The inkjet head is preferably capable of forming picoliter level droplets, and for example, KM512 or KM1024 (manufactured by Konica Minolta. Inc.) may be used. The head scan speed is preferably a value at which the dot pitch in the scanning direction may be set to an appropriate value (50 to 500 μm), preferably 10 to 200 mm/sec, and more preferably 80 to 100 mm/sec.

<<Applications of Organic EL Element>>

The organic EL element of the present invention can be suitably used in an organic EL display device that emits dot light to reproduce patterning and characters, and/or emits multicolor light to display high-quality color images with improved color mixing.

The organic EL element of the present invention can be suitably used in a lighting device or various light emitting sources. Examples include home lighting, in-vehicle lighting, backlighting for clocks and liquid crystal displays, billboard advertisements, traffic signals, light sources for optical storage media, light sources for electrophotocopiers, light sources for optical communication processors, and light sources for optical sensors.

EXAMPLES

Hereinafter, the present invention will be specifically described with reference to examples, but the present invention is not limited thereto. In the examples, the indication of "part" or "%" is used, unless otherwise specified, to represent "part by mass" or "mass %".

Example 1

After patterning on a substrate (NA-45, manufactured by NH Techno Glass), a glass substrate (100 mm×100 mm×1.1 mm) with ITO (indium tin oxide) having a thickness of 100 nm deposited thereon, it was ultrasonically washed with isopropyl alcohol, dried with dry nitrogen gas, and then rinsed with UV ozone for 5 minutes. Thus, a transparent support substrate with an ITO transparent electrode (anode) was obtained.

After deposition on the ITO transparent electrode of the transparent support substrate with a solution of poly(3,4-ethylenedioxythiophene)-polystyrene sulfonate (PEDOT/PSS, manufactured by Bayer, Baytron P Al 4083) diluted to 70% with pure water by spin coating at 3000 rpm for 30 seconds and drying at 200° C. for 1 hour, a hole injecting layer with a thickness of 30 nm was formed.

Next, it was attached to a vacuum evaporation apparatus, and the vacuum chamber was depressurized to $4\times10^{-4}$ Pa. The deposition was further carried out under the following conditions.

As the host layer A, the host compound (base compound 1) (4,4'-N,N-dicarbazole-biphenyl) (CBP) was deposited at a deposition rate of 1 Å/sec to achieve a layer thickness of 40 nm.

Then, under the following inkjet conditions, the light emitting compound 1 (coumarin 6: 3-(2-benzothiazolyl)-7-(diethylamino)coumarin) solution (ink) was injected onto the host layer A to form the light emitting layer.

The surface of the formed light emitting layer was observed under an optical microscope, and almost no evidence of erosion by time solvent was observed after dropping the solution by the light emitting inkjet. Therefore, it can be assumed that most of the solvent dries without soaking after being dropped on the surface of time host layer A, and as a result, the light emitting compound is present near the surface of the host layer A and has a concentration gradient in the direction of the thickness.

[Chem. 10]

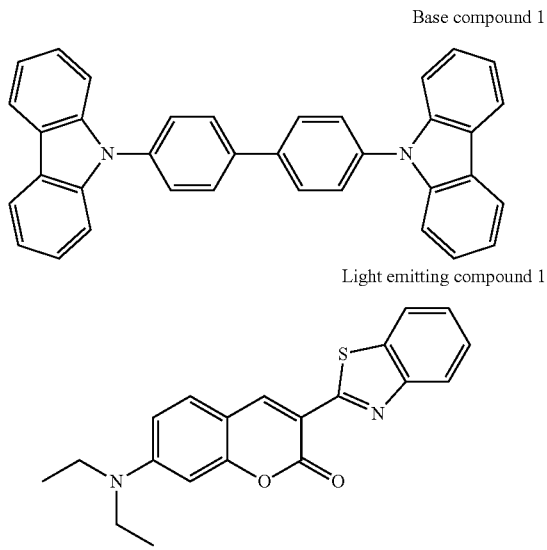

Base compound 1

Light emitting compound 1

<Inkjet Printing Condition>

The inkjet printer used was IJCS-1 manufactured by Konica Minolta, and the inkjet head used was KM512 manufactured by Konica Minolta.

A mixture of 1H,1H,7H-dodecafluoro-1-heptanol (DFHO) and 2-propanol in the ratio of 7:3 was used as the solvent. Further, the light emitting compound 1 was mixed with the above solvent at a ratio of 1 mg/mL. After heating for 30 minutes using ultrasonic waves and filtering through a 0.2 µm filter, the agglomerated components were removed and the solution was prepared.

Distance between ejection nozzles of the head was set to 140 µm pitch, and the head scan speed was set to 90 mm/sec. In this way, dots were formed evenly at a pitch of 140 µm vertically and horizontally in a display area of 2 mm×2 mm. The number of ejection shots was two.

Figure 1B:
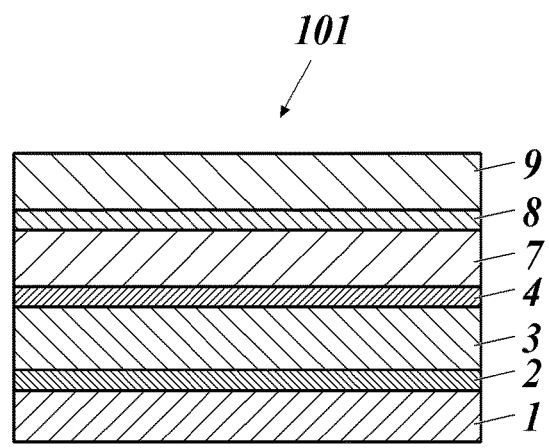

As the host layer B, the base compound 1 (4,4'-N,N-dicarbazole-biphenyl) (CBP) was deposited at a deposition rate of 1 Å/sec to achieve a layer thickness of 20 nm. Then, cesium (electron injecting layer) was deposited at a deposition rate of 0.1 Å/sec to a thickness of 1.5 nm. After that, the cathode (Al) was deposited at a deposition rate of 4 Å/sec to achieve a layer thickness of 100 nm. The organic EL element was thus manufactured. Cross-sectional schematic diagrams of the resulting organic EL element are shown in FIGS. 1A and 1B.

Figure 2A:
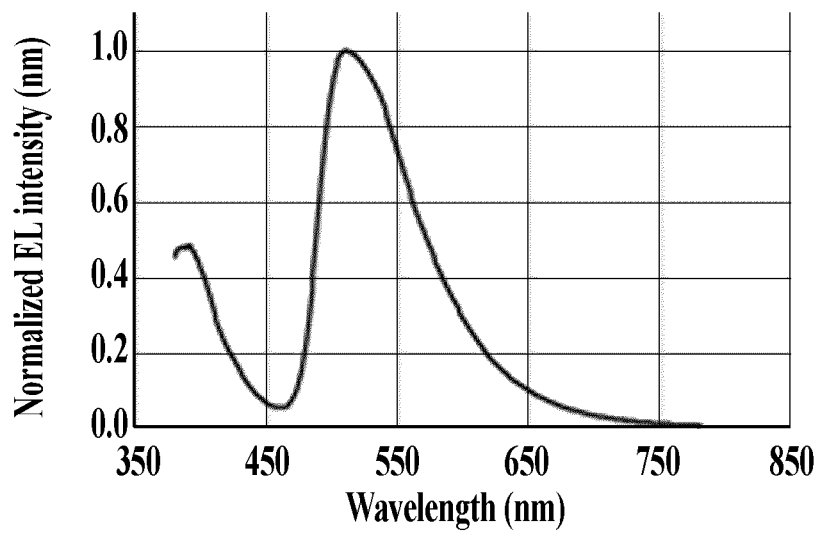
FIGS. 2A and 2B are diagrams showing a spectral emission distribution (A) and a microscopic photograph (B) of an organic EL element upon voltage application.
Figure 2B:
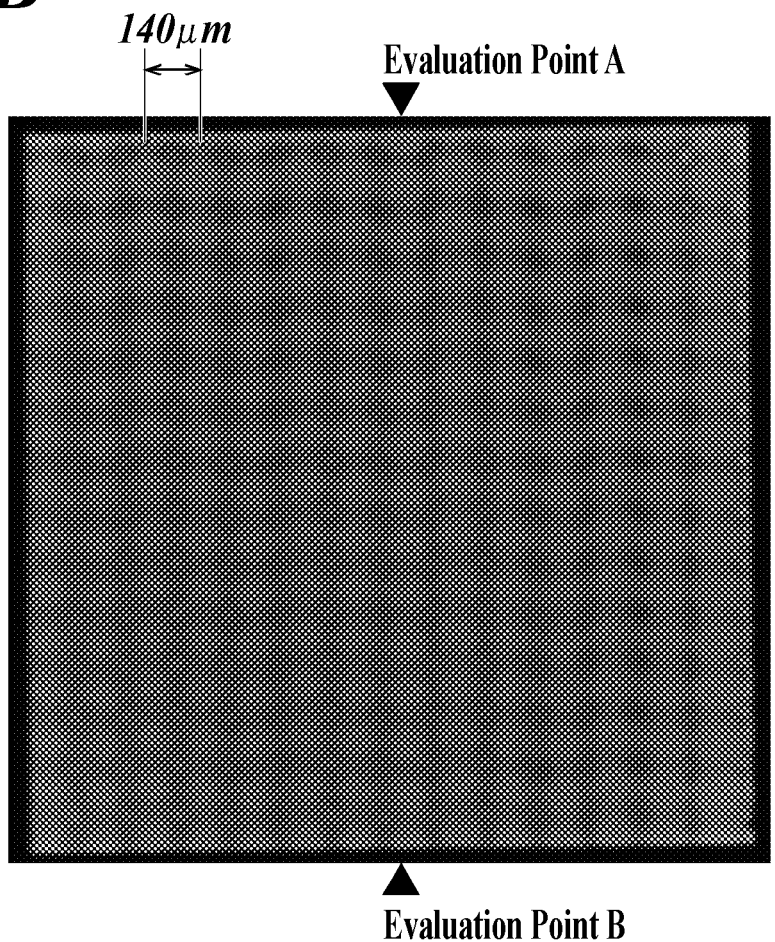

FIGS. 2A and 2B show a spectral emission distribution graph of the manufactured organic EL element upon application of 12 volts (FIG. 2A), and a microscopic photograph (2 mm×2 mm) (FIG. 2B). The emission maximum wavelength (peak wavelength) is around 500 nm, indicating that the spectral emission distribution is derived from light emitting compound 1 (coumarin 6).

Also, an image with a pattern corresponding to 140 µm, which is the ejection nozzle pitch, has been obtained, including dots formed with very good reproducibility. (This shows an element configuration where there are dots ("emitter dots") containing the light emitting compound 1 (emitter) in all areas, and there is a concentration gradient.)

Figures 3A, 3B:
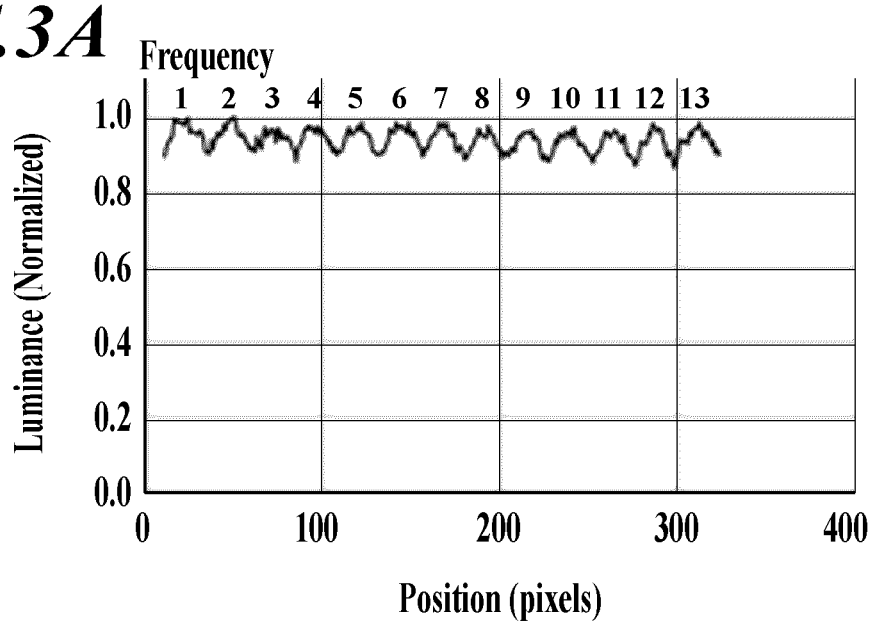
FIGS. 3A and 3B are diagrams showing a relationship between dot positions including a light emitting compound and luminance (A) and the maximum and minimum values of the luminance (B).

FIGS. 3A and 3B show a graph of the evaluated luminance from evaluation point A to evaluation point B in FIG. 2B (FIG. 3A) and values of quantified luminance at respective center portions of the thirteen convex cycles (FIG. 3B). The vertical axis of FIG. 3A is normalized by the maximum luminance value. The numerical values in FIG. 3B show the luminance at the center where the light emitting compound 1 (emitter) landed (average of 10 pixels in the center of the dot). The difference between the maximum and minimum values is 0.03, indicating very good reproducibility of the luminance distribution.

The luminance was measured according to the following procedure. First, a digital image of the organic EL element upon application of 12 volts was obtained using a digital microscope system manufactured by Moritex Corporation. Next, the digital image was divided into red, blue, and green images using image processing software "Image-J". Using the green image, which is the emission color of light emitting compound 1 (coumarin), the luminance values for each pixel position from evaluation points A to B were obtained.

Example 2

The organic EL element was manufactured in the same way as in Example 1, except that the host layers A and B were changed to a host compound (Base compound 2 (5methyl-([5]-cyclometaphenylene (5Me-[5]CMP)) The structure of the host compound (base compound 2) is shown below.

[Chem. 11]

Base compound 2

Figure 4A:
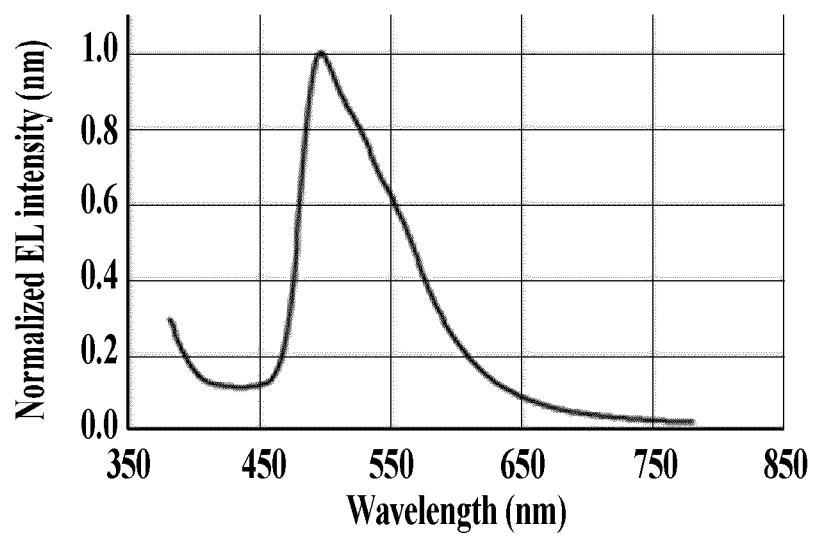
FIGS. 4A and 4B are diagrams showing a spectral emission distribution (A) and a microscopic photograph (B) of an organic EL element upon voltage application.
Figure 4B:
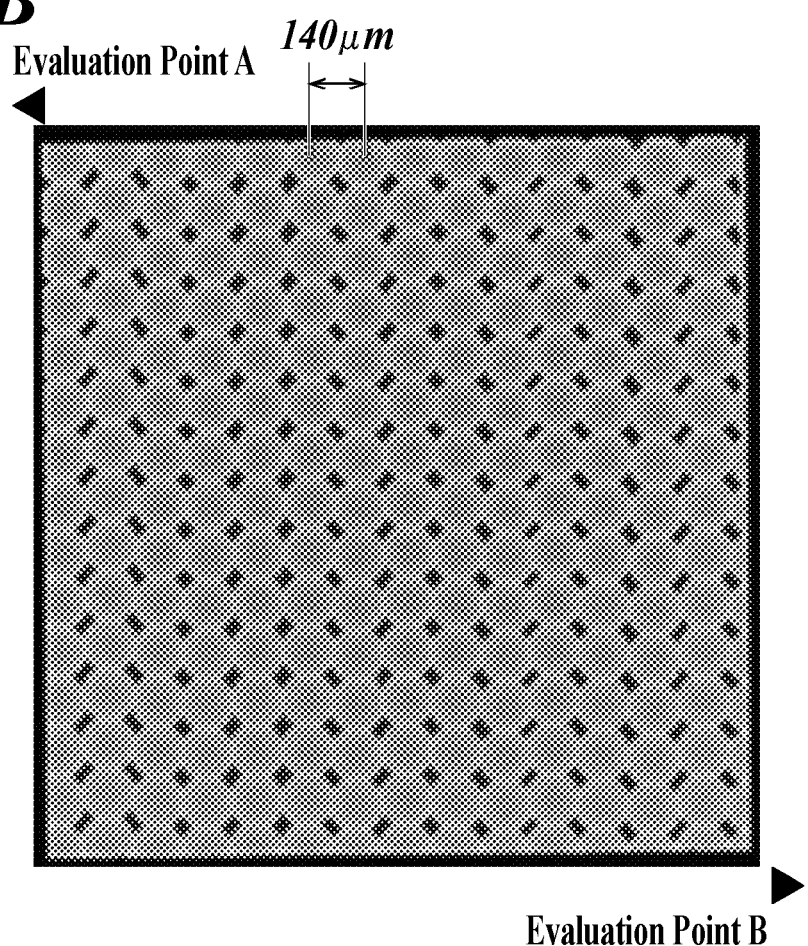

FIGS. 4A and 4B show a spectral emission distribution graph of the manufactured organic EL element upon application of 12 volts (FIG. 4A), and a microscopic photograph (2 mm×2 mm) (FIG. 4B). The emission maximum wavelength (peak wavelength) is around 500 nm, indicating that the spectral emission distribution is derived from light emitting compound 1 (coumarin 6). Also, an image with a pattern corresponding to 140 μm, the ejection nozzle pitch, has been obtained, including dots formed with very good reproducibility. (This shows an element configuration where there are areas containing no light emitting compound 1 (emitter).)

Figures 5A, 5B:
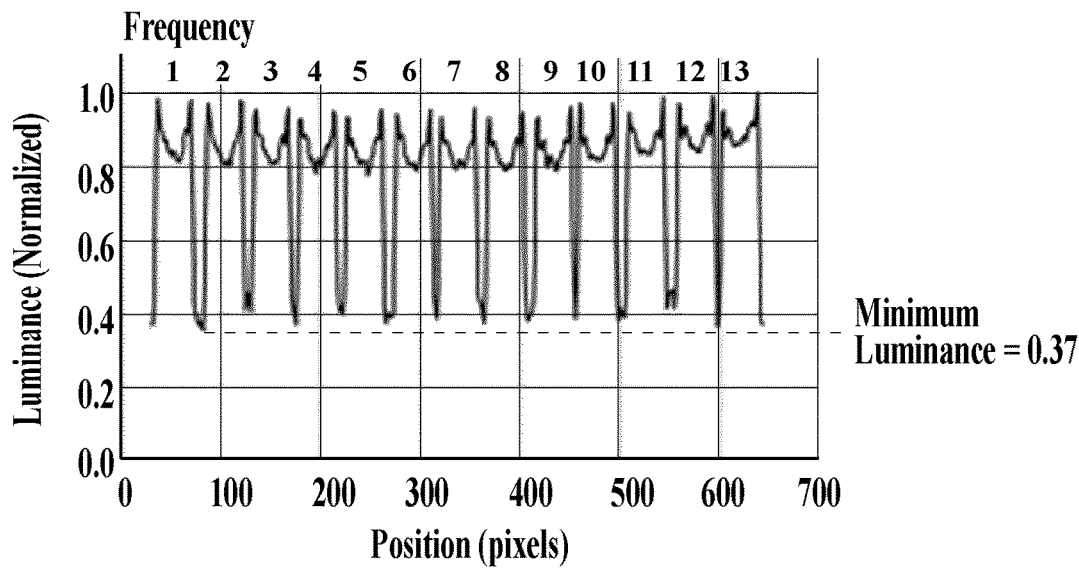
FIGS. 5A and 5B are diagrams showing a relationship between dot positions including a light emitting compound and luminance (A) and the maximum and minimum values of the luminance (B).

A graph of the evaluated luminance (in a diagonal direction) from evaluation point A to evaluation point B in FIG. 4B is shown in FIG. 5A, and values of quantified luminance at respective center portions of the thirteen convex cycles (FIG. 5B; using the same evaluation method as that in Example 1). The numerical values show the luminance at the center where the light emitting compound 1 (emitter) landed. The difference between the maximum and minimum values is 0.06, indicating very good reproducibility of the luminance distribution. As shown in FIG. 5A, the maximum luminance was more than twice the minimum luminance (with respect to the maximum luminance set to be 1, the minimum luminance was 0.37). The dot shape was clearer than in Example 1.

To clarify the factor that causes the maximum luminance to be more than twice the minimum luminance, the solution of this example was dropped onto the thin layers of base compounds 1 and 2 of the examples, and after drying, the diameter of the droplets was measured. The measured results were 173 μm on the host compound 1 and 131 μm on the host compound 2 (this example).

Also, observation was made after inkjetting of the solution onto the host compound 2 in the same way as in Example 1, and almost no evidence of erosion by the solvent was observed.

Accordingly, it is possible to lower the wettability with the solution (increase the contact angle) and reduce the area of the emitting compound (EL dot diameter) on the host compound 2. As a result, the minimum luminance is considered to be reduced by using compound 2 in this example.

The droplet diameter was measured using an inkjet device with dot measurement function (DMP-2850, Manufactured by FujiFilm Dimatix, Inc.).

Example 3

The organic EL element was manufactured in the same way as in Example 2, except that the number of shots was changed from ore to two in the conditions of inkjet ejection.

FIGS. 6A and 6B show a spectral emission distribution graph of the manufactured organic EL element upon application of 12 volts (FIG. 6A), and a microscopic photograph (2 mm×2 mm) (FIG. 6B). The emission maximum wavelength (peak wavelength) is around 500 nm, indicating that the spectral emission distribution is derived from light emitting compound 1 (coumarin 6). Also, an image with a pattern corresponding to 140 μm, which is the ejection nozzle pitch, has been obtained, including dots formed with very good reproducibility. (This shows an element configuration where a clear dot shape is formed.)

Figures 7A, 7B:
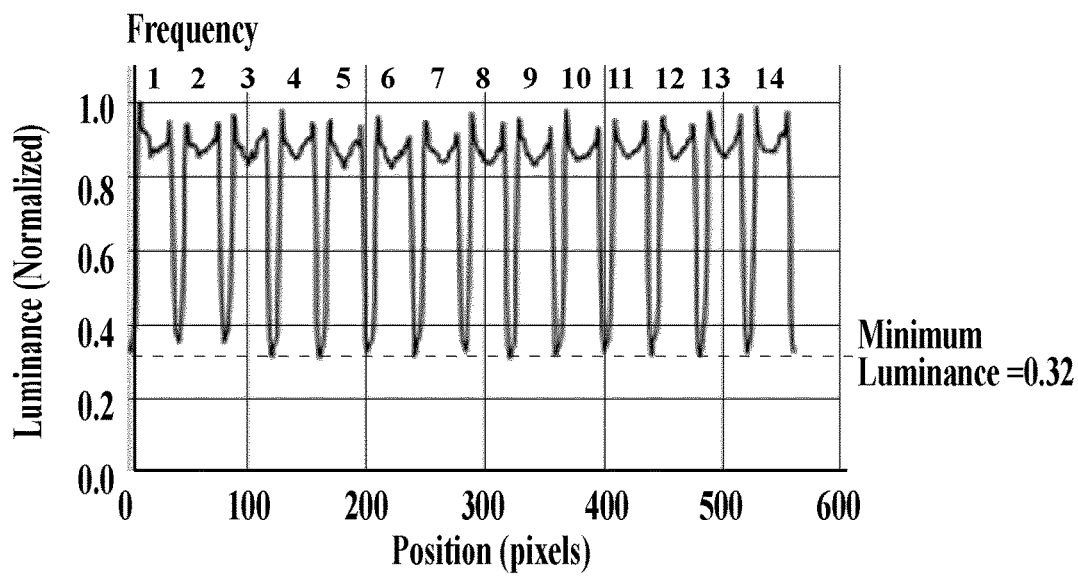
FIGS. 7A and 7B are diagrams showing a relationship between dot positions including a light emitting compound and luminance (A) and the maximum and minimum values of the luminance (B).

FIGS. 7A and 7B show a graph of the evaluated luminance from evaluation point A to evaluation point B in FIG. 6B (FIG. 7A) and values of quantified luminance at respective center portions of the fourteen convex cycles (FIG. 7B; using the same evaluation method as those in Example 1 and Example 2). The numerical values show the luminance at the center where the light emitting compound 1 (emitter) landed. The difference between the maximum and minimum values is 0.04, indicating very good reproducibility of the luminance distribution. As shown in FIG. 7A, the maximum luminance was more than twice the minimum luminance (with respect to the maximum luminance of 1, the minimum luminance was 0.37) The dot shape was clearer than in Example 1.

Example 4

The organic EL element was manufactured in the same way as in Example 2, except that three different inkjet heads were used, light emitting compounds 1, 2, and 3 were used, and the overlap portion between electrodes was 6 mm×16 mm.

[Chem. 12]

Light emitting compound 2

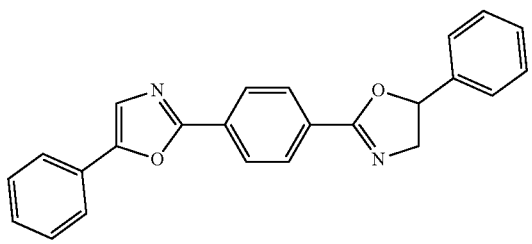

Light emitting compound 3

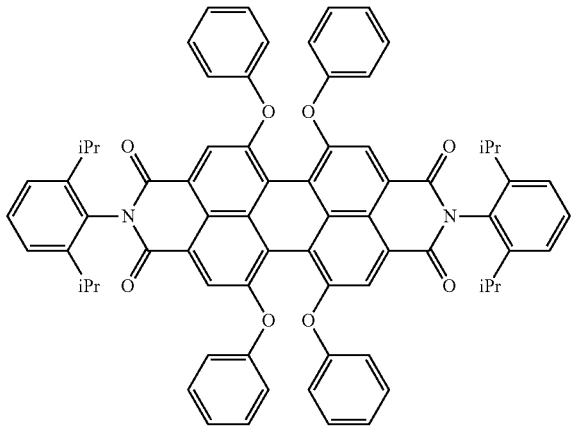

Figure 8:
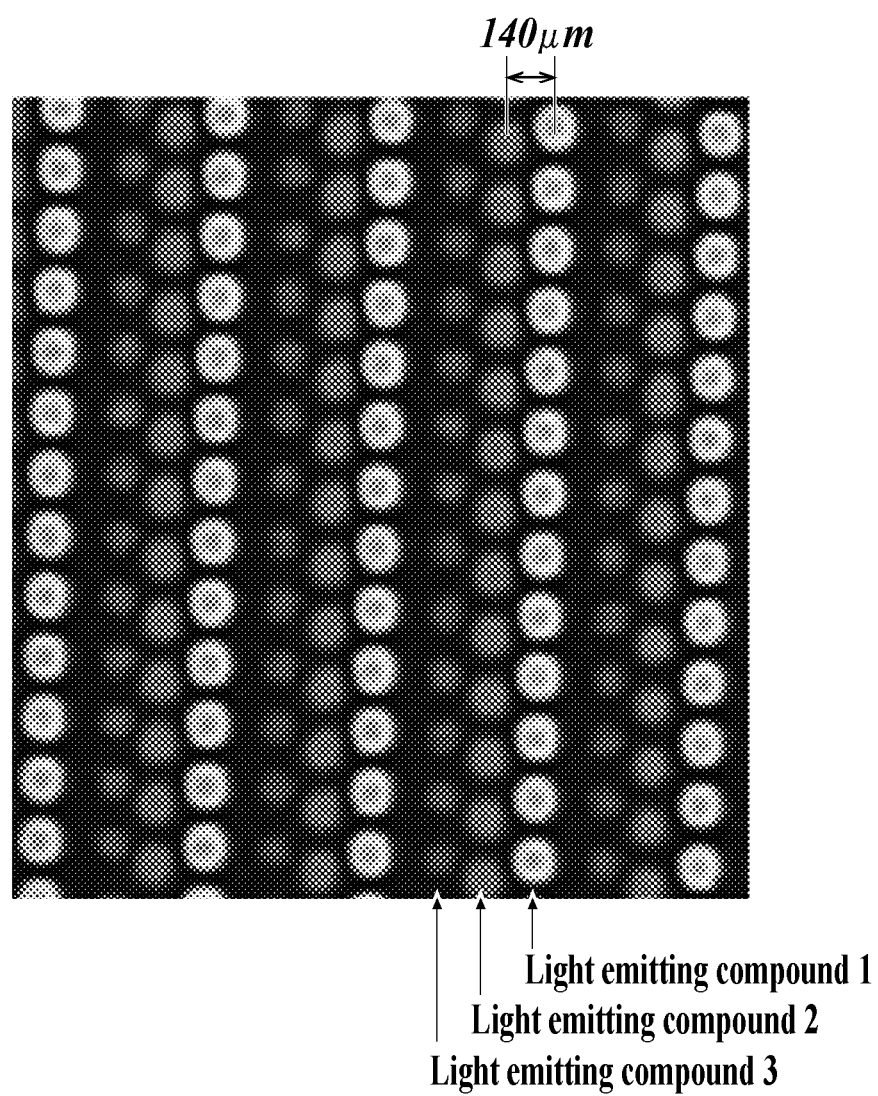
FIG. 8 is an optical micrograph of an organic EL element upon voltage application.

FIG. 8 shows a microscopic photograph upon application of 12 volts to the manufactured organic EL element. An image with a pattern corresponding to 140 μm, which is the ejection nozzle pitch, has been obtained, including dots formed with very good reproducibility. Also, it can be seen that there is no color mixing between each compound despite the high resolution dots.

Example 5

The organic EL element was manufactured in the same way as in Example 2, except that the solution (ink) containing the light emitting compound 1 (coumarin 6) was changed to a chain aromatic compound 3 (base compound 3 below) and a light emitting compound 4 (at the mass ratio of 90:10).

The luminance was evaluated in exactly the same way, and the maximum luminance was found to be 10% higher than that of a comparative example, indicating that there was an effect of higher luminance. Thus, in addition to its usual function as a host compound, the chain aromatic compound 3 (base compound 3 below) was found to improve ink characteristics (dissolution assistance effect of light emitting materials, dispersion effect of light emitting materials, and thickening effect of the ink).

Comparative Example

A mixed solution of the host compound 3 and the light emitting compound 4 was ejected under the following inkjet printing conditions on the hole injecting layer to form the light emitting layer.

<Inkjet Printing Condition>

The inkjet printer used was IJCS-1 manufactured by Konica Minolta, and the inkjet head used was KM512 manufactured by Konica Minolta.

Tetralin was used as the solvent. The host compound (base compound 3) and the light emitting compound 4 in the ratio of 97:3 were used as solutes, and the above solvent was further used to make a 10 mg/mL solution. After heating for 30 minutes using ultrasonic waves and filtering through a 0.2 µm filter, the agglomerated components were removed and the solution was prepared. Under the condition that distance between ejection nozzles of the head was set to 70 µm pitch, the head scan speed was set to 90 mm/sec, and the number of shots was set to six, ejection was performed evenly at a pitch of 70 µm in an area of 2 mm×2 mm, larger than the overlap portion between electrodes, to form the light emitting layer.

Figure 9A:
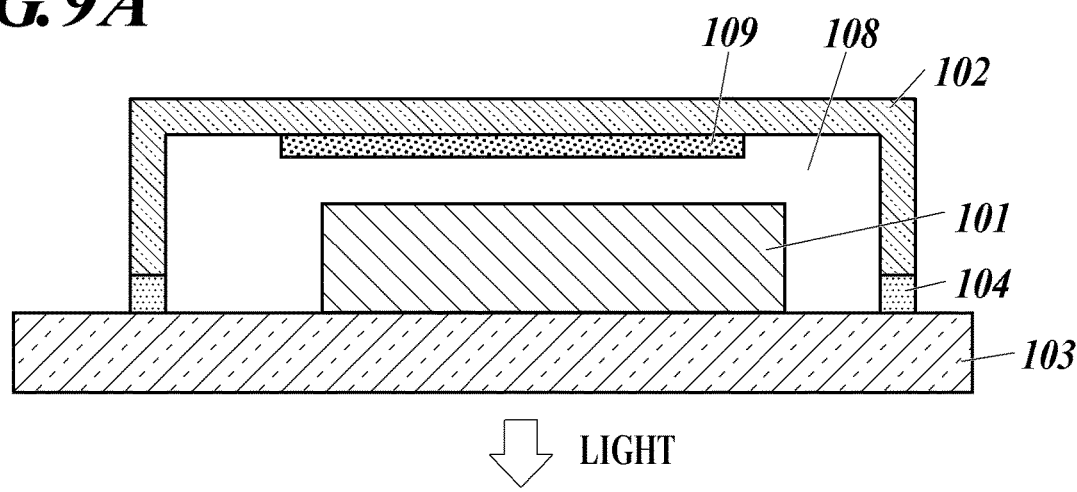
FIGS. 9A and 9B are schematic diagrams showing a cross-section of an organic EL display device and an organic EL element.
Figure 9B:
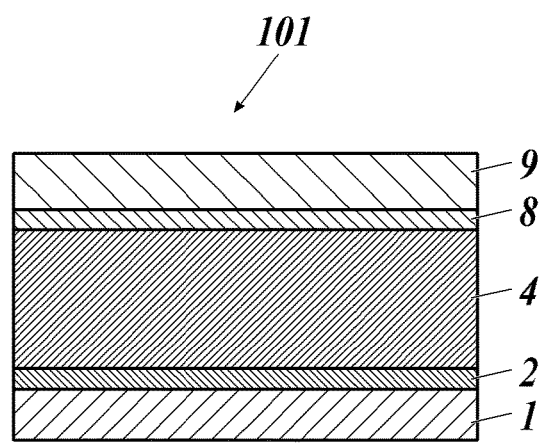

Then, cesium (electron injecting layer) was deposited at a deposition rate of 0.1 Å/sec until the layer thickness became 1.5 nm. Then, as the cathode, aluminum (Al) was deposited at a deposition rate of 4 Å/sec to until the layer thickness became 100 nm to manufacture an organic EL element. Cross-sectional schematic diagrams of the obtained organic electronics element are shown in FIGS. 9A and 9B. The host compound (base compound 3) and the light emitting compound 4 are shown below.

[Chem. 13]

Base compound 3

Light emitting compound 4

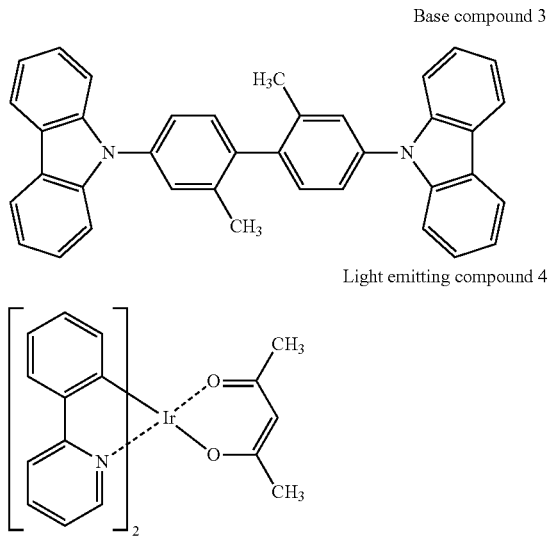

FIG. 10A shows a microscopic photograph upon application of 12 volts to the manufactured organic EL element (area 2×2 mm similar to FIGS. 2A, 4A, and 6A). Uneven luminescence was observed, likely due to uneven layer thickness.

FIG. 10B shows a graph of the evaluated luminance from evaluation point A to evaluation point B in FIG. 10B, and the numerical luminance values are shown (FIG. 10C). The difference between the maximum and minimum values is 0.97, indicating very poor reproducibility of the luminance distribution as shown in FIGS. 10A to 10C.

Table I shows comparison results of the difference in luminance (luminance reproducibility) between Examples 1, 2, and 3 of the present invention and the comparative example. (Table I shows the maximum value, the minimum value, and the difference in FIG. 3B, FIG. 5B, FIG. 7B, and FIG. 10C.)

TABLE I

| Luminance property | Example 1 Luminance | Example 2 Luminance | Example 3 Luminance | Comparative Example Luminance |
|---|---|---|---|---|
| Maximum value | 0.98 | 0.87 | 0.88 | 1.00 |
| Minimum value | 0.96 | 0.81 | 0.85 | 0.03 |
| Difference | 0.03 | 0.06 | 0.04 | 0.97 |

The comparison shown in Table I reveals that the organic EL element of the present invention has a very small difference in luminance and excellent luminance reproducibility.

INDUSTRIAL APPLICABILITY

The present invention makes it possible to provide an organic electroluminescent element that prevents in-plane unevenness and color mixing even in forming a high-definition image in a full-color display system using a pair of electrodes, a method for producing same, and a display device using the organic electroluminescent element.

REFERENCE SIGNS LIST

1 Anode (ITO transparent electrode)
2 Hole injecting layer
3 Host layer A
4 Light emitting layer (FIG. 1B; emitter only, or FIG. 9B; host and emitter)
7 Host layer B
8 Electron injecting layer (cesium)
9 Cathode (aluminum)
101 Organic electronics device
102 Glass case
103 Glass substrate
104 Sealing material
108 Nitrogen gas
109 Water-collecting agent

The invention claimed is:

1. An organic electroluminescent element having at least one pair of electrodes including an anode and a cathode and one or more organic functional layers between the anode and the cathode that are in a pair, comprising:
an organic functional layer that exists as a continuous phase over an entire display area and includes an at least one light emitting compound with a concentration gradient in an in-plane direction and in a thickness direction of the organic functional layer, wherein the organic functional layer comprises a low molecular weight host compound, and a ratio of the low molecular weight host compound to a total host compound in the organic functional layer is 90% or more.

2. The organic electroluminescent element according to claim 1, wherein the organic functional layer has the concentration gradient in a pattern that is repeated a plurality of times in the in-plane direction.

3. The organic electroluminescent element according to claim 1, wherein, in the organic functional layer, a maximum luminance in the in-plane direction is more than twice a minimum luminance in the in-plane direction.

4. The organic electroluminescent element according to claim 1, wherein the light emitting compound exists in a shape of dots in the in-plane direction.

5. The organic electroluminescent element according to claim 1, wherein the light emitting compound includes multiple types of different light emitting compounds.

6. The organic electroluminescent element according to claim 1, wherein dots that emit light of same color are adjacent to each other in the in-plane direction.

7. A method for producing an organic electroluminescent element having at least one pair of electrodes including an anode and a cathode and one or more organic functional layers between the anode and the cathode in the pair, the method comprising:

forming the anode and the cathode in a pair each individually;

forming an organic functional layer that exists as a continuous phase over an entire display area; and dropping a solution containing a light emitting compound onto the organic functional layer to form an organic functional layer containing the light emitting compound with a concentration gradient in an in-plane direction and in a thickness direction of the organic functional layer, wherein the organic functional layer comprises a low molecular weight host compound, and a ratio of the low molecular weight host compound to a total host compound in the organic functional layer is 90% or more.

8. The method for producing an organic electroluminescent element according to claim 7, further comprising:

forming a second organic functional layer on the organic functional layer containing the light emitting compound.

9. The method for producing an organic electroluminescent element according to claim 7, wherein the solution containing the light emitting compound is dropped by an inkjet printing method.

10. A display device comprising:

the organic electroluminescent element according to claim 1.

* * * * *